(12) United States Patent
Plakhotnyuk et al.

(10) Patent No.: US 12,049,700 B2
(45) Date of Patent: Jul. 30, 2024

(54) ATOMIC LAYER PROCESS PRINTER

(71) Applicant: ATLANT 3D Nanosystems ApS, Taastrup (DK)

(72) Inventors: Maksym Plakhotnyuk, Kgs. Lyngby (DK); Ole Hansen, Hørsholm (DK); Boisen Anja, Kgs. Lyngby (DK); Tomas Rindzevicius, Malmó (SE); Ivan Kundrata, Bratislava (SK); Karol Fröhlich, Bratislava (SK); Julien Bachmann, Erlangen (DE)

(73) Assignee: ATLANT 3D Nanosystems ApS, Taastrup (DK)

( * ) Notice: Subject to any disclaimer, the term of this patent is extended or adjusted under 35 U.S.C. 154(b) by 393 days.

(21) Appl. No.: 17/616,165

(22) PCT Filed: Jun. 3, 2020

(86) PCT No.: PCT/EP2020/065396
§ 371 (c)(1),
(2) Date: Dec. 2, 2021

(87) PCT Pub. No.: WO2020/245230
PCT Pub. Date: Dec. 10, 2020

(65) Prior Publication Data
US 2022/0307133 A1    Sep. 29, 2022

(30) Foreign Application Priority Data
Jun. 4, 2019 (EP) .................................... 19178248

(51) Int. Cl.
| | |
|---|---|
| *B33Y 10/00* | (2015.01) |
| *B29C 64/159* | (2017.01) |
| *B29C 64/209* | (2017.01) |
| *B33Y 30/00* | (2015.01) |
| *C23C 16/455* | (2006.01) |
| *C23C 16/56* | (2006.01) |
| *C23C 16/04* | (2006.01) |

(52) U.S. Cl.
CPC ...... *C23C 16/45544* (2013.01); *B29C 64/159* (2017.08); *B29C 64/209* (2017.08);
(Continued)

(58) Field of Classification Search
CPC ........ C23C 16/45544; C23C 16/45555; C23C 16/56; C23C 16/04; C23C 16/45576;
(Continued)

(56) References Cited

U.S. PATENT DOCUMENTS

| | | | |
|---|---|---|---|
| 2003/0071877 A1 | 4/2003 | Hess | |
| 2013/0012029 A1* | 1/2013 | Vermeer | H01J 37/32568 427/535 |

(Continued)

FOREIGN PATENT DOCUMENTS

| | | |
|---|---|---|
| CN | 108346716 A | 7/2018 |
| JP | 2013-520572 | 6/2013 |

(Continued)

OTHER PUBLICATIONS

Office Action issued in Chinese Application No. 2020800414443, dated Sep. 6, 2023.
(Continued)

*Primary Examiner* — Yaovi M Ameh
(74) *Attorney, Agent, or Firm* — Knobbe Martens Olson & Bear

(57) ABSTRACT

The invention relates to an atomic layer process printer for material deposition, etching and/or cleaning on an atomic scale in a selective area. The invention further relates to a method for material deposition, etching and/or cleaning on an atomic scale in a selective area using the atomic layer process printer.

20 Claims, 24 Drawing Sheets

(52) U.S. Cl.
CPC ............... *B33Y 10/00* (2014.12); *B33Y 30/00* (2014.12); *C23C 16/45555* (2013.01); *C23C 16/56* (2013.01); *C23C 16/04* (2013.01); *C23C 16/45576* (2013.01)

(58) Field of Classification Search
CPC ..... B29C 64/159; B29C 64/209; B33Y 10/00; B33Y 30/00
See application file for complete search history.

(56) References Cited

U.S. PATENT DOCUMENTS

| | | | |
|---|---|---|---|
| 2015/0086716 A1* | 3/2015 | Park | C23C 16/45536 427/255.28 |
| 2016/0203995 A1* | 7/2016 | Kanarik | H01J 37/32009 156/345.26 |
| 2017/0350688 A1* | 12/2017 | Boyd, Jr. | G01B 11/14 |
| 2019/0032211 A1 | 1/2019 | Tucker et al. | |

FOREIGN PATENT DOCUMENTS

| | | |
|---|---|---|
| KR | 20180110311 A | 10/2018 |
| TW | 201641731 A | 5/2020 |

OTHER PUBLICATIONS

International Search Report issue for International Patent Application No. PCT/EP2020/065396, dated Oct. 19, 2020 in 4 pages.
Office Action issued in Japanese Application No. 2021-572382, dated Apr. 16, 2024.

\* cited by examiner

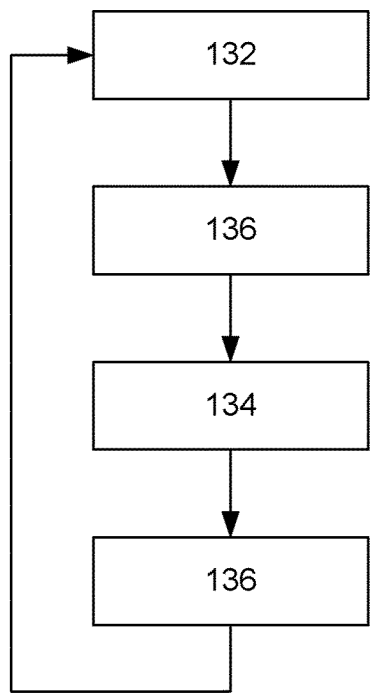
Fig. 1A – prior art
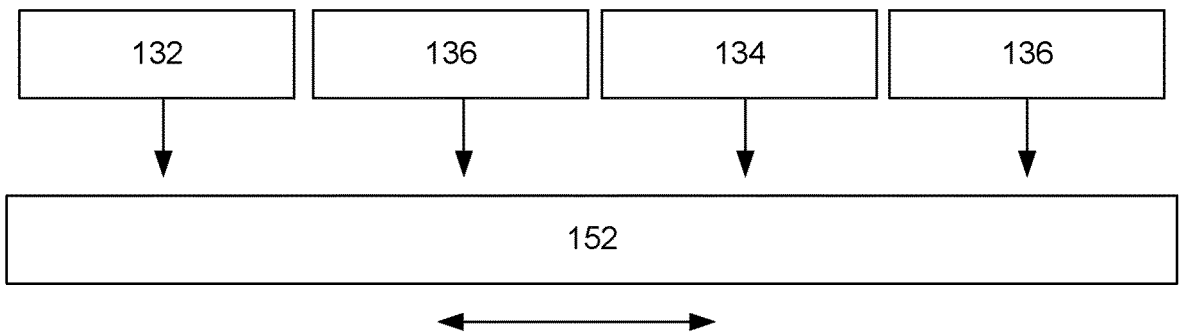
Fig. 1B – prior art

Possition across three printed Platinum lines[μm]

ATOMIC LAYER PROCESS PRINTER

CROSS-REFERENCE TO RELATED APPLICATIONS

This application is the U.S. National Phase under 35. U.S.C. § 371 of International Application PCT/EP2020/065396, filed Jun. 3, 2020, which claims priority to European Patent Application No. 19178248.1, filed Jun. 4, 2019. The disclosures of the above-described applications are hereby incorporated by reference in their entirety.

FIELD OF THE INVENTION

The invention relates to an atomic layer process printer for material deposition, etching and/or cleaning on an atomic scale in a selective area. The invention further relates to a method for material deposition, etching and/or cleaning on an atomic scale in a selective area using the atomic layer process printer.

BACKGROUND

There exists a number of prototyping and additive nanoscale manufacturing tools. However, they often have difficulties including low processing speed, problems operating at atmospheric conditions, an excessive usage of materials, and complexity to process different materials simultaneously. Further, many of the existing method requires high price of tools.

Atomic Layer Deposition (ALD) is an example of a method used as a nanoscale manufacturing tool for printing of continuous films on flat surfaces. The principles behind ALD is that the surface is subjected to a first precursor gas, which adsorbs on the surface, afterwards the excess first precursor gas is evacuated and after full evacuation of the excess the second precursor gas is introduced, completing the reaction on the surface. In general, ALD relies on two or multi step reactions to control the deposition process. The ALD can be operated in two manners; a temporal ALD and a spatial ALD. Overall Spatial ALD separates the different gases in space whereas temporal ALD separates the gases in time.

The temporal ALD utilizes a chamber, wherein a substrate is positioned. The substrate in the chamber is typically subjected to a first precursor gas, which adsorbs on the surface, subjected to an inert gas for cleaning the chamber, subjected to second precursor gas, which reacts with the first precursor gas on the surface, and is subjected to an inert gas for cleaning the chamber. This process may be repeated, or combined with other processes, until the desired product is obtained. Temporal ALD is often considered a slow method and requires a large amount of gases as the entire chamber is to be filled in each step. The spatial selectivity is not inherently possible.

Spatial ALD performs the same type of steps as the temporal ALD. However, instead of using a chamber for depositing material on a surface, spatial ALD uses a spatial separation of the gases and instead moves the sample relative to the printer head in the X, Y direction. Depending on the setup either the printer head moves or the sample moves.

Using spatial ALD allows for a faster depositing compared to temporal ALD, and normally a reduction in the amount of gas used is obtained as the deposition occurs locally instead of in one lager chamber. With spatial ALD, the need for emptying the chamber between each dose of a gas is further removed.

Independently of whether temporal ALD or spatial ALD is used, providing a three dimensional structures is not possible. There is therefore a need for a three dimensional structuring system, which provides high resolution nanoscale three dimensional structures.

DESCRIPTION OF THE INVENTION

Disclosed herein in a first aspect is an Atomic Layer Process Printer for material deposition, etching and/or cleaning on an atomic scale in a selective area. The printer may comprise a substrate plate for holding a substrate where onto one or more fluids are deposable using the printer, and a printer head positioned opposite the substrate on the substrate plate.

The printer head will normally comprise a printer head plate with a number of openings including:
  one or more first exit openings each having a first exit opening diameter being smaller than 900 micro meters;
  one or more second exit openings;
  one or more third exit openings;
  one or more exhaust openings.

The printer may further comprise:
  a first inlet supply channel connected to the one or more first exit openings for guiding a first precursor fluid onto the substrate through the one or more first exit openings;
  a second inlet supply channel connected to the one or more second exit openings for guiding a second precursor fluid onto the substrate through the one or more second exit openings;
  a third inlet supply channel connected to the one or more third exit openings for guiding an inert fluid onto the substrate through the one or more third exit openings;
  one or more outlet channels connected to the one or more exhaust openings for removing non-deposited first precursor fluid, non-deposited second precursor fluid, and inert fluid from substrate.

The substrate plate is normally movable in relation to the printer head:
  along an axis in an X,Y plane defined by an X axis and an Y axis being perpendicular in relation to each other;
  along a Z axis being perpendicular to the X,Y plane; and
  at a first angle φ defining a rotation of the X,Y plane around the Z axis.

The substrate plate and the printer head are also normally movable in relation to each other at a second angle θ defining a tilting of the X,Y plane around an axis in the X,Y plane.

The one or more exhaust openings may include one or more first exhaust openings connected to a first outlet channel for removing non-deposited first precursor fluid, and possibly inert fluid, from the substrate; and one or more second exhaust openings connected to a second outlet channel for removing non-deposited second precursor fluid, and possibly inert fluid, from the substrate.

Disclosed herein in a second aspect is an Atomic Layer Process Printer for material deposition, etching and/or cleaning on an atomic scale in a selective area. The printer may comprise a substrate plate for holding a substrate where onto one or more fluids are deposable using the printer, and a printer head positioned opposite the substrate on the substrate plate. The printer head normally comprises a printer head plate with a number of openings including:

one or more first exit openings each having a first exit opening diameter being smaller than 900 micro meters;
one or more third exit openings;
one or more exhaust openings.

The printer may further comprise:
a first inlet supply channel connected to the one or more first exit openings for guiding a first precursor fluid onto the substrate through the one or more first exit openings;
a third inlet supply channel connected to the one or more third exit openings for guiding an inert fluid onto the substrate through the one or more third exit openings;
one or more outlet channels connected to the one or more exhaust openings for removing non-deposited first precursor fluid, non-deposited second precursor fluid, and inert fluid from substrate.

The substrate plate is normally movable in relation to the printer head:
along an axis in an X,Y plane defined by an X axis and an Y axis being perpendicular in relation to each other;
along a Z axis being perpendicular to the X,Y plane; and
at a first angle φ defining a rotation of the X,Y plane around the Z axis.

The substrate plate and the printer head are also normally movable in relation to each other at a second angle θ defining a tilting of the X,Y plane around an axis in the X,Y plane.

The one or more exhaust openings may include one or more first exhaust openings connected to a first outlet channel for removing non-deposited first precursor fluid, and possibly inert fluid, from the substrate; and one or more second exhaust openings connected to a second outlet channel for removing non-deposited second precursor fluid, and possibly inert fluid, from the substrate.

The second inlet supply channel and the second exit openings can be omitted in second aspect compared to the first aspect by having a second precursor fluid in a chamber surrounding the substrate.

Disclosed herein in a third aspect is an Atomic Layer Process Printer for material deposition, etching and/or cleaning on an atomic scale in a selective area. The printer may comprise a substrate plate for holding a substrate where onto one or more fluids are deposable using the printer, and a printer head positioned opposite the substrate on the substrate plate.

The printer head may comprise a printer head plate with a number of exit openings including one or more first exit openings each having a first exit opening diameter being smaller than 900 micro meters.

The printer may further comprise a plurality of inlet supply channels connected to the one or more first exit openings, the plurality of inlet supply channels comprising:
a first inlet supply channel for guiding a first precursor fluid onto the substrate;
a second inlet supply channel for guiding a second precursor fluid onto the substrate;
a third inlet supply channel for guiding an inert fluid onto the substrate.

The printer may further comprise one or more outlet channels connected to one or more exhaust openings for removing non-deposited first precursor fluid, non-deposited second precursor fluid, and inert fluid from substrate.

The substrate plate is normally movable in relation to the printer head:
along an axis in an X,Y plane defined by an X axis and an Y axis being perpendicular in relation to each other;
along a Z axis being perpendicular to the X,Y plane; and
in a first angle φ defining a rotation of the X,Y plane around the Z axis.

The substrate plate and the printer head are also normally movable in relation to each other at a second angle θ defining a tilting of the X,Y plane around an axis in the X,Y plane.

The one or more exhaust openings may include one or more first exhaust openings connected to a first outlet channel for removing non-deposited first precursor fluid, and possibly inert fluid, from the substrate; and one or more second exhaust openings connected to a second outlet channel for removing non-deposited second precursor fluid, and possibly inert fluid, from the substrate.

In the third aspect, the precursor fluids and the inert fluid will normally be alternatingly supplied to the substrate through the one or more exit openings. This resembles a temporal ALD type process whereas the first and second aspect resembles the spatial ALD type process.

Disclosed herein in a fourth aspect is a method for material deposition on a substrate in a selective area. The method comprises the steps of:
providing an atomic layer process printer with a substrate plate and a printer head positioned opposite each other, wherein the substrate plate is movable in relation to the printer head:
along an axis in an X,Y plane defined by an X axis and an Y axis being perpendicular in relation to each other;
along a Z axis being perpendicular to the X,Y plane; and
at a first angle φ defining a rotation of the X,Y plane around the Z axis.

The substrate plate and the printer head are also normally movable in relation to each other at a second angle θ defining a tilting of the X,Y plane around an axis in the X,Y plane.

The method according to the forth aspect further comprises:
positioning a substrate on the substrate plate;
exposing the substrate to a first precursor fluid through one or more first exit openings each having a diameter smaller than 900 micro meters;
removing the first precursor fluid not deposited on the substrate by means of one or more exhaust openings in combination with exposing the substrate to an inert fluid;
exposing the substrate with the first precursor deposited thereon to a second precursor fluid;
removing the second precursor fluid not deposited on the substrate by means of the one or more exhaust openings in combination with exposing the substrate to an inert fluid.

Disclosed herein in a fifth aspect is a method for vertical material deposition on a substrate in a selective area, the method comprising the steps of providing an atomic layer process printer with a substrate plate and a printer head positioned opposite each other, wherein the substrate plate is movable in relation to the printer head:
along an axis in an X,Y plane defined by an X axis and an Y axis being perpendicular in relation to each other;
along a Z axis being perpendicular to the X,Y plane; and
at a first angle φ defining a rotation of the X,Y plane around the Z axis.

The substrate plate and the printer head are also normally movable in relation to each other at a second angle θ defining a tilting of the X,Y plane around an axis in the X,Y plane.

The method according to the fifth aspect further comprises:
positioning a substrate on the substrate plate;
exposing the substrate to a first precursor fluid through one or more first exit openings each having a diameter smaller than 900 micro meters;
removing the first precursor fluid not deposited on the substrate by means of one or more exhaust openings in combination with exposing the substrate to an inert fluid through the one or more first exit openings;
exposing the substrate with the first precursor deposited thereon to a second precursor fluid through the one or more first exit openings;
removing the second precursor fluid not deposited on the substrate by means of the one or more exhaust openings in combination with exposing the substrate to an inert fluid through the one or more first exit openings.

Disclosed herein in a sixth aspect is a method for rapid material deposition on a substrate in a selective area, the method comprising the steps of providing an atomic layer process printer with a substrate plate and a printer head positioned opposite each other wherein the substrate plate is movable in relation to the printer head:
along an axis in an X,Y plane defined by an X axis and an Y axis being perpendicular in relation to each other;
along a Z axis being perpendicular to the X,Y plane; and
at a first angle φ defining a rotation of the X,Y plane around the Z axis.

The substrate plate and the printer head are also normally movable in relation to each other at a second angle θ defining a tilting of the X,Y plane around an axis in the X,Y plane.

The method according to the sixth aspect further comprises:
positioning a substrate on the substrate plate;
mixing a first precursor fluid and a second precursor fluid;
exposing the substrate to the mixture of the first precursor fluid and the second precursor fluid through one or more first exit openings each having a diameter smaller than 900 micro meters.

Disclosed herein in a seventh aspect is a method for material etching on a substrate in a selective area, the method comprising the steps of providing an atomic layer process printer with a substrate plate and a printer head positioned opposite each other wherein the substrate plate is movable in relation to the printer head:
along an axis in an X,Y plane defined by an X axis and an Y axis being perpendicular in relation to each other;
along a Z axis being perpendicular to the X,Y plane; and
at a first angle φ defining a rotation of the X,Y plane around the Z axis.

The substrate plate and the printer head are also normally movable in relation to each other at a second angle θ defining a tilting of the X,Y plane around an axis in the X,Y plane.

The method according to the seventh aspect further comprises:
positioning a substrate on the substrate plate;
exposing the substrate to a first etching agent through one or more first exit openings each having a diameter smaller than 900 micro meters;
removing the first etching agent not deposited on the substrate by means of one or more exhaust openings in combination with exposing the substrate to an inert fluid through the one or more first exit openings;
exposing the substrate with the first precursor deposited thereon to a second etching agent through the one or more first exit openings;
removing the second etching agent not deposited on the substrate by means of the one or more exhaust openings in combination with exposing the substrate to an inert fluid through the one or more first exit openings.

By the term fluid is also included gas. Examples of precursor fluids may e.g. include organic, inorganic, and metal-based precursor fluids.

By one or more exhaust openings are also included different types of exhaust openings, e.g. one or more first exhaust openings for removing excess of the first precursor fluid, and one for the second exhaust openings for removing excess of the second precursor fluid.

By the printer according to the first, second, and/or third aspect and the method according to the fourth, fifth, sixth, and/or seventh aspect is obtained a printer and a method, which allows cleaning, deposition and etching of materials from e.g. fluid or gas phase, for obtaining film, pattern and 3D structure formations with an atomic scale resolution in the transverse direction and a nanometer resolution in the lateral direction. By transverse direction is meant a direction parallel to the Z axis. By lateral direction is meant direction is meant a direction parallel to the X, Y plane.

Compared to the conventional ALD technology, the possibility of move the substrate plate and the printer head in relation to each other at a full 3D orientation opens up possibility for the creation of 3D structures in an easy manner at the same time as providing a very high atomic scale resolution in the transverse direction and a nanometer resolution in the lateral direction. This results in a state of the art printer based on the principles of spatial ALD technology.

By making the substrate plate movable in relation to the printer head in the X, Y, Z plane and in a first angle φ defining a rotation of the X,Y plane around the Z axis an improved control of a 3D geometry of the printed structure is obtainable.

US2013012029A1 discloses an ALD printer with a printer head being able to be moved in the XYZ plane. The distribution of the exit/exhaust channels is different from that in the above described aspects, and only provides area deposition extending in an XY plane, i.e. a single plane proving only a 2D resolution and not a 3D resolution. Obtaining 3D structures directly from printing using the ALD printer in US2013/012029A1 is not possible.

An atomic scale thickness resolution (digital growth control) and pattern resolution down to 12 nm may be obtainable by the printer according to the first, second, and/or third aspect and the method according to the fourth, fifth, sixth, and/or seventh aspect.

Having one or more first exit openings each with a diameter smaller than 900 micro meters is essential for obtaining the low resolution obtainable with the printer according to the first, second, and/or third aspect and the method according to the fourth, fifth, sixth, and/or seventh aspect.

In one or more examples, the first exit opening diameter is smaller than 800 µm, such as smaller than 700 µm, such as smaller than 600 µm, such as smaller than 500 µm, such as smaller than 400 µm, such as smaller than 300 µm, such as smaller than 200 µm, such as smaller than 100 µm, such as smaller than 50 µm.

The separate channels and openings, further enables accurate micro/nanoscale feature printing. It provides high purity of printed materials by avoiding cross contamination of materials. Thus, multi material printing with fast switching between the different materials with short pulse valves and short distance of the gas sources to print head may be used.

On the contrary, in the ALD printer discloses in US2015086716A1 having outlet openings in the range of 1-12 mm, such resolutions are not obtainable. The milli metres openings entails that the process and printer of US2015086716A1 rely on the Bernoulli's principle, which states that within a fluid flowing horizontally, the highest speed occurs where the pressure is lowest, and the lowest speed occurs where the pressure is highest. When working with micro sized openings below 100 micro meters, as is the case for the printer according to the first, second, and/or third aspect and the method according to the fourth, fifth, sixth, and/or seventh aspect, the Bernoulli principle is expected to start failing due to the increase in speed associated, and fast molecule scattering from the impact. More generally, the Bernoulli principle is only applicable for isentropic flows, not taking into account turbulence and high mach number flows.

In US2015086716A1, the printer head moves in relation to the substrate plate, which is stationary. In the printer according to the first, second, and/or third aspect and the method according to the fourth, fifth, sixth, and/or seventh aspect, the substrate plate is instead moved in the XYZ plane in relation to the printer head. This difference provides a difference in rigidity, possible speeds, and eases the maintainment of plan-parallelism necessary for the printer to operate.

The printer according to the first, second, and/or third aspect and the method according to the fourth, fifth, sixth, and/or seventh aspect allows for use in both cleaning, depositing and/or etching of fluids/materials with inorganic, organic and metals composition. When the printer is used for etching, the term precursor fluids is meant to also include etching fluids/agents.

The printer according to the first, second, and/or third aspect and the method according to the fourth, fifth, sixth, and/or seventh aspect may operate without plasma and may process e.g. Titanium isopropoxide (TTIP) with water for obtaining Titanium dioxide ($TiO_2$). In addition, the printer may handle sulphide, oxide, nitrides and pure metals printing, as well as core complex three and four element compound material printing. Thus, in or one or more examples, the precursor fluids when printed form sulphide, oxide, nitrides, pure metals, and core complex three and four element compound material.

The printer according to the first, second, and/or third aspect and the method according to the fourth, fifth, sixth, and/or seventh aspect allows for also allows for formation of continuous films, and patterns. Material multi-stacking and high conformality to any surface morphology is obtainable with the printer according to the first, second, and third aspects.

A high deposition speed is further obtainable using the printer according to the first, second, and/or third aspect and the method according to the fourth, fifth, sixth, and/or seventh aspect. The printer may operate at room temperature and higher temperatures such as 400 degrees C. By the printer operating at a temperature is meant that at least the printer head is connected to heating sources for heating it to the specific temperature. Further, the substrate plate may also be heated to an elevated temperature.

The printer may be operate at atmospheric pressure or at low vacuum pressure in open and controlled ambient. By the printer operating at a specific pressure is meant that at least the printer head is kept at atmospheric pressure or at low vacuum pressure in open and controlled ambient. It has an advantageously low consumption of reactive fluids, and it provides a material versatility. Further, additive and subtractive processing, selective area high resolution and conformality processing on various plain and corrugated inorganic and organic substrates are possible.

In one or more examples, the one or more exhaust openings include one or more first exhaust openings connected to a first outlet channel for removing non-deposited first precursor fluid (and possibly inert fluid) from the substrate; and one or more second exhaust openings connected to a second outlet channel for removing non-deposited second precursor fluid (and possibly inert fluid) from the substrate.

By having separated exhaust openings for each of the precursor fluids, chemical clogging in the exhaust channel and thereby any potential damage to the printer is prevented. If the two exhaust channels were merged in one, the fluids would react in a merge channel and clog it leading to failure of the operation.

The one or more exhaust channels may be driven to a pressure of at least approximately 20 mbar by a vacuum pump. The pressure will normally be measured at the inlet.

In one or more examples, the X,Y plane is extending in parallel with the substrate plate. Similarly, the rotation of the X,Y plane around the Z axis may be a rotation of the substrate plate. Also, the tilting of the X,Y plane may be a tilting of the substrate plate in relation to the printer head. In one or more examples, the printer head is tiltable. The second angle $\theta$ may be in the range of 0.5-10 degrees, such as 1-5 degrees, such as 2-4 degrees, or such as 2.5-3.5 degrees.

The Z axis may extend between the printer head and the substrate plate defining a distance between the printer head and the substrate plate. The distance between the printer head and the substrate plate is in a range of 0.005-100 µm, such as 0.005-50 µm, such as 0.01-50 µm, such as 0.05-50 µm, such as 0.1-50 µm, such as 0.1-25 µm, or such as 1-10 µm.

In one or more examples, the first exit opening diameter is smaller than 800 µm, such as smaller than 700 µm, such as smaller than 600 µm, such as smaller than 500 µm, such as smaller than 400 µm, such as smaller than 300 µm, such as smaller than 200 µm, such as smaller than 100 µm, such as smaller than 50 µm.

In one or more examples, the first exit opening diameter is in a range of 0.005-850 µm, such as 0.005-750 µm, such as 0.005-650 µm, such as 0.005-550 µm, such as 0.005-450 µm, such as 0.005-250 µm, such as 0.005-100 µm, such as 0.01-50 µm, such as 0.01-10 µm, such as 0.01-1 µm, such as 0.015-0.05 µm, such as 0.02 µm.

In one or more examples, the printer is adapted for providing a pattern resolution of 20 nm-1 mm. To achieve a specific resolution, the size of the first exit opening should be approximately 0.625-1.25 times that of the desired resolution.

The resolution of the printed structure, i.e. the resolution size, depends on both the diameter of the one or more first exit openings and the distance between the printer head and the substrate plate.

In one or more examples, the outlet surface of the printer head further comprises a safety evacuation channel positioned outermost around the first, second, and third exit openings and the exhaust openings. The outermost exhaust openings, e.g. the second exhaust openings, may serve as the safety evacuation channel. The safety evacuation channels has two functions; it allows the printer to work under atmospheric conditions if the second precursor used is dangerous, such as ozone or hydrogen sulphide, and further improving the local inert atmosphere around the deposition area.

In one or more examples, the printer head outlet surface is in the form of a disc, a square, a rectangle, a triangle, a pentangle, or similar with the sets of opening each forms a circular discs. The printer head outlet surface may preferably be in the form of a disc.

In one or more examples, the printer is adapted for varying the distance between the printer head and the substrate plate during printing of a three-dimensional structure.

In one or more examples, the printer is adapted for operating at a deposition speed of 1 nm/min or below. The deposition speed is a factor of the speed of substrate movement, temperature, and reactivity of selected first and second precursor fluids. Adaptation is undergone by tuning of the movement of the substrate.

In one or more examples, the printer is adapted for operating at a deposition speed in a range of 0.1-100 nm/min, such as 1-100 nm/min, such as 1-50 nm/min, such as 0.1-10 nm/min, such as 0.5-10 nm/min, such as 1-10 nm/min.

In one or more examples, the printer is adapted for operating at atmospheric pressure. In other examples, the printer is adapted for operating at vacuum or ultra-high vacuum. By the printer operating at a specific pressure is meant that at least the printer head is kept at atmospheric pressure or at low vacuum in open and controlled ambient.

In one or more examples, the printer is adapted for controlling a temperature of the printer head. The printer may comprise a heating/cooling source heating at least the printer head to allow for it to operate temperatures between 10-600° C., such as between 15-450° C., such as between 20-400° C. By the printer operating at a temperature is meant that at least the printer head is connected to heating sources for heating it to the specific temperature. Further, the substrate plate may also be heated to an elevated temperature. All types of tubing/conduit, valves, and precursor and/or inert gas supplies may also be heated/cooled to control the temperature. Thus, the printer may be adapted for controlling the temperature of the supply channels. This allows for a printer fully operational at a desired temperature, e.g. a temperature well above room temperature.

In one or more examples, the supply channels are made from stainless steel, Teflon, fluoroelastomer materials (FKM), or perfluoroelastomeric compounds (FFKM). This provides control channels where the temperature can be controlled.

The temperature control may extend to the entire tubing channels extending from the containers containing the precursors through the valves and supply channel system to the printer head. The temperature may be controlled in different zones, such as e.g. at least three zones.

In one or more examples, the printer is adapted for operating in a bottom-up set where the printer head is positioned above the substrate plate.

In one or more examples, the printer head plate further comprises:
one or more first distribution channels adapted for guiding the first precursor fluid from the first inlet supply channel to the one or more first exit openings;
one or more second distribution channels adapted for distributing the second precursor fluid from the second inlet supply channel to the one or more second exit openings;
one or more third distribution channels adapted for distributing the inert fluid from the third inlet supply channel to the one or more third exit openings.

In one or more examples, the printer head plate is removably attached to the printer head such that different printer head plates can be connected to the printer head, the different printer head plates having varying sizes of the opening diameter of the first exit opening.

In one or more examples, the one or more second and third exit openings and the one or more exhaust openings are positioned around the one or more first exit openings.

In one or more examples, the one or more second and third exit openings and the one or more exhaust openings are positioned circumferentially around each of the one or more first exit openings.

In one or more examples, the one or more second and third exit openings and the one or more exhaust openings are positioned symmetrically around the one or more first precursors openings. In one or more examples, the one or more first exit openings comprises a first exit opening positioned centrally in the printer head plate.

In one or more examples, a primary set of exhaust openings is positioned between each of the first exit openings and a primary set of second exit openings; and/or a primary set of third exit openings is positioned between each of the first exit openings and a primary set of second exit openings.

In one or more examples, there is a precursor fluid distance between the one or more first exit openings and the primary set of second exit openings being between 5 μm and 3.000 μm, or such as between 5 μm and 500 μm, or such as between 5 μm and 100 μm, or such as between 5 μm and 30 μm, or such as between 10 μm and 20 μm, or such as between 30 μm and 3.000 μm, or such as between 50 μm and 2.000 μm, or such as between 100 μm and 1000 μm.

In one or more examples, the printer comprises a multiple of printer heads. Including multiple printer heads is not a straightforward process when the printer head has micro scale openings, i.e. it is a micronozzle print head. Each of the micronozzle requires special mounting mechanics and micronozzle design. Also, successfully connecting the multiple printer heads to the same gas distributing system is not straightforward.

In one or more examples, the printer head is made from ceramic or metal, such as corrosive resistance steel.

In one or more examples, the printer is adapted for alternatively supplying the first precursor fluid, the inert fluid and the second precursor fluid onto the substrate.

The printer according to the second and fifth aspect may further comprise a chamber surrounding the substrate, wherein the chamber is adapted containing a second precursor fluid.

BRIEF DESCRIPTION OF THE DRAWINGS

Various examples are described hereinafter with reference to the figures. Like reference numerals refer to like elements throughout. Like elements will, thus, not be described in detail with respect to the description of each figure. It should also be noted that the figures are only intended to facilitate the description of the examples. They are not intended as an exhaustive description of the claimed invention or as a limitation on the scope of the claimed invention. In addition, an illustrated example needs not have all the aspects or advantages shown. An aspect or an advantage described in conjunction with a particular example is not necessarily limited to that example and can be practiced in any other examples even if not so illustrated, or if not so explicitly described.

FIG. 1A illustrates temporal atomic layer deposition and FIG. 1B illustrates spatial atomic layer deposition.

DESCRIPTION OF EXAMPLES

Figure 2:
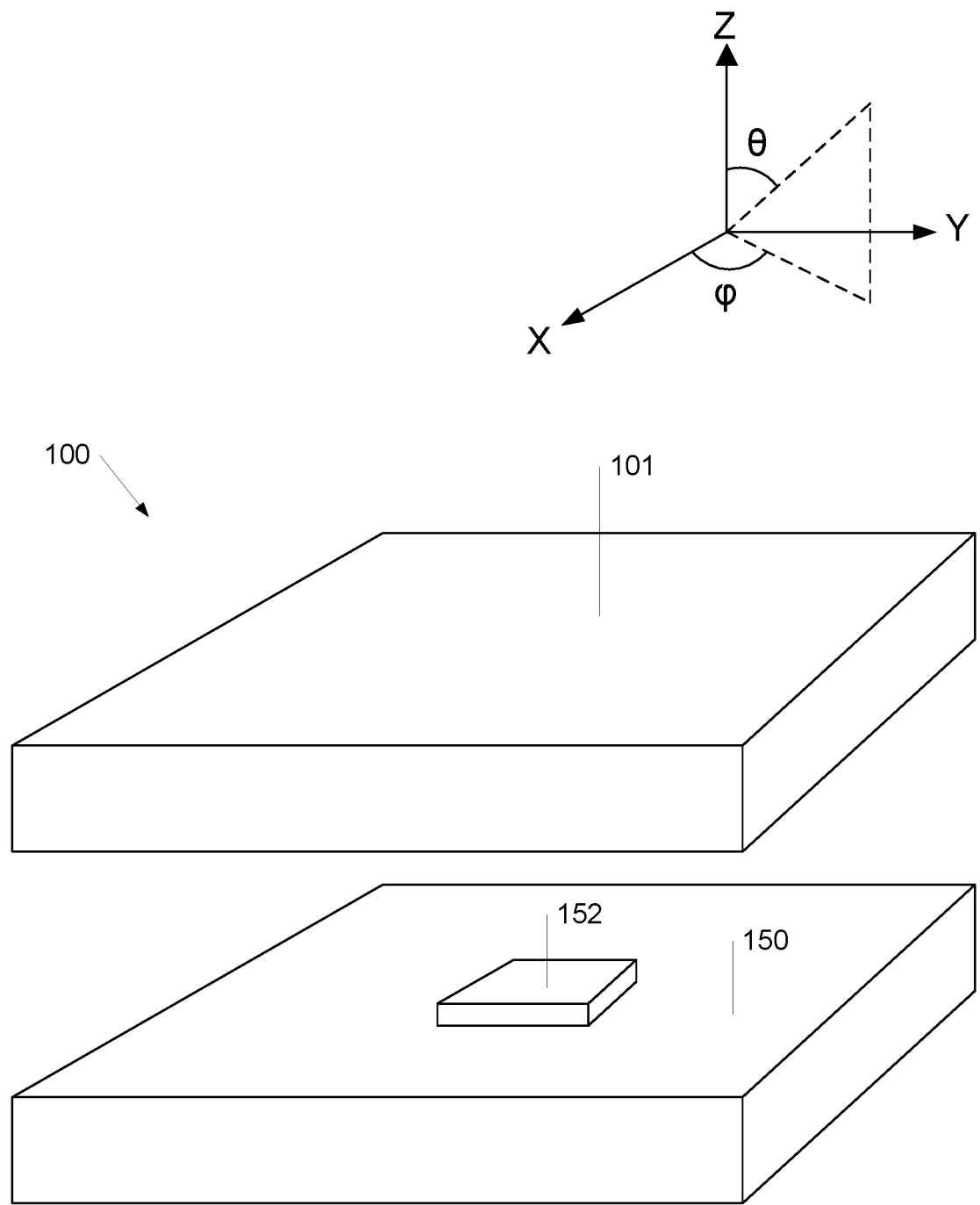
FIG. 2 illustrates schematically an atomic layer process printer for material deposition, etching and/or cleaning on an atomic scale in a selective area.

Exemplary examples will now be described more fully hereinafter with reference to the accompanying drawings. In this regard, the present examples may have different forms and should not be construed as being limited to the descriptions set forth herein. Accordingly, the examples are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

In the drawings, thicknesses of a plurality of layers and areas are illustrated in an enlarged manner for clarity and ease of description thereof. When a layer, area, element, or plate is referred to as being "on" another layer, area, element, or plate, it may be directly on the other layer, area, element, or plate, or intervening layers, areas, elements, or plates may be present therebetween. Conversely, when a layer, area, element, or plate is referred to as being "directly on" another layer, area, element, or plate, there are no intervening layers, areas, elements, or plates therebetween. Further when a layer, area, element, or plate is referred to as being "below" another layer, area, element, or plate, it may be directly below the other layer, area, element, or plate, or intervening layers, areas, elements, or plates may be present therebetween. Conversely, when a layer, area, element, or plate is referred to as being "directly below" another layer, area, element, or plate, there are no intervening layers, areas, elements, or plates therebetween.

The spatially relative terms "lower" or "bottom" and "upper" or "top", "below", "beneath", "less", "above", and the like, may be used herein for ease of description to describe the relationship between one element or component and another element or component as illustrated in the drawings. It will be understood that the spatially relative terms are intended to encompass different orientations of the device in use or operation, in addition to the orientation depicted in the drawings. For example, in the case where a device illustrated in the drawings is turned over, elements described as being on the "lower" side of other elements, or "below" or "beneath" another element would then be oriented on "upper" sides of the other elements, or "above" another element. Accordingly, the illustrative term "below" or "beneath" may include both the "lower" and "upper" orientation positions, depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below, and thus the spatially relative terms may be interpreted differently depending on the orientations described.

Throughout the specification, when an element is referred to as being "connected" to another element, the element is "directly connected" to the other element, or "electrically connected" to the other element with one or more intervening elements interposed therebetween.

The terminology used herein is for the purpose of describing particular examples only and is not intended to be limiting. As used herein, the singular forms "a," "an," and "the" are intended to include the plural forms, including "at least one," unless the content clearly indicates otherwise. "At least one" is not to be construed as limiting "a" or "an." It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an idealized or overly formal sense unless expressly so defined in the present specification.

Exemplary examples are described herein with reference to cross section illustrations that are schematic illustrations of idealized examples, wherein like reference numerals refer to like elements throughout the specification. As such, variations from the shapes of the illustrations as a result, for example, of manufacturing techniques and/or tolerances, are to be expected. Thus, examples described herein should not be construed as limited to the particular shapes of regions as illustrated herein but are to include deviations in shapes that result, for example, from manufacturing. For example, a region illustrated or described as flat may have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims. Some of the parts which are not associated with the description may not be provided in order to specifically describe exemplary examples of the present disclosure.

FIG. 1A illustrates temporal atomic layer deposition (ALD), where the precursor fluids are separated in time and FIG. 1B illustrates spatial atomic layer deposition (ALD), where the precursor fluids are separated in space.

The temporal ALD utilizes a chamber, wherein a functionalized substrate is positioned. The substrate in the chamber is typically subjected to a first precursor gas 132, which deposit on the functionalised surface, subjected to an inert fluid 136 for cleaning the chamber, subjected to second precursor gas 134, which deposit on the surface covered by the first gas is now deposited, and subjected to an inert gas 136 for cleaning the chamber. This process may be repeated until the desired product is obtained as illustrated in FIG. 1A.

Spatial ALD performs the same type of steps as the temporal ALD. However, instead of using a larger chamber for depositing material on a surface, spatial ALD uses a spatially separation of the precursor fluids 132, 134 and the inert fluid 136 and instead moves the sample substrate 162 in the X, Y direction as illustrated in FIG. 1B.

FIG. 2 illustrates very schematically an atomic layer process printer 100 as disclosed herein for material deposition, etching and/or cleaning on an atomic scale in a selective area. The printer 100 comprises a substrate plate 160 for holding a substrate 162 and a printer head 101 positioned opposite the substrate 162 on the substrate plate 160. The X, Y, and Z axis are illustrated in the top right corner of FIG. 2. Also, the first angle $\varphi$ defining a rotation of the X,Y plane around the Z axis, and the second angle $\theta$ defining a tilting of the X,Y plane around an axis in the X,Y plane are illustrated in the top right corner of FIG. 2. The substrate plate 160 and the printer head 101 are movable in relation to each other in one or more of the X,Y, Z plane and/or around the two angles $\varphi$ and $\theta$. In this manner a full 3D movement is obtainable.

The printer 100 will normally operate in a bottom-up set where the printer head 101 is positioned above the substrate plate 160 as shown in FIG. 2. Normally, the substrate plate 160 will be moving in the X,Y, Z plane and/or around the two angles $\varphi$ and $\theta$, and the printer head 101 will be kept stationary. However, movement of the printer head 101 in the X,Y, Z plane and/or around the two angles $\varphi$ and $\theta$ can also be envisioned while the substrate plate 160 is kept stationary. Alternatively, movement of both the substrate plate 160 and the printer head 101 simultaneously may also be possible.

As shown in FIG. 2, the X,Y plane can be extending in parallel with the substrate plate 160. The rotation of the X,Y plane around the Z axis may therefore be a rotation of the substrate plate 160. Normally the substrate 162 is fixed to the substrate plate 160. The tilting of the X,Y plane may be a tilting of the substrate plate 160 in relation to the printer head 101. Any movement of the substrate plate will therefore translate to a movement of the substrate 162.

The Z axis extends between the printer head 101 and the substrate plate 160 defining a distance between the printer head 101 and the substrate plate 160. The distance between the printer head 101 and the substrate plate 160 may be in a range of 0.005-100 µm, such as 0.005-50 µm, such as 0.01-50 µm, such as 0.05-50 µm, such as 0.1-50 µm, such as 0.1-25 µm, or such as 1-10 µm.

The distance between the printer head 101 and the substrate plate 160 are variable during printing of a three-dimensional structure. The substrate plate 160 and the printer head 101 may be movable in relation to each other in two or more of: along axis in the X,Y plane; along the Z axis; the first angle $\varphi$; and the second angle $\theta$. Alternatively, the substrate plate 160 and the printer head 101 are movable in relation to each other in three or all of: along axis in the X,Y plane; along the Z axis; the first angle $\varphi$; and the second angle $\theta$. The distance between the printer head 101 and the substrate plate 160 may also be variable during printing of a three-dimensional structure.

The printer 100 will be able to deposit at least one molecular layer per minute. Normally, this will provide a maximum of 100 nm per minute repositioning. The printer thus may operate at a deposition speed in a range of 0.1-100 nm/min, such as 1-100 nm/min, such as 1-50 nm/min, such as 0.1-10 nm/min, such as 0.5-10 nm/min, such as 1-10 nm/min. The printer may normally operate at a deposition speed of 1 nm/min or below.

The printer 100 is adapted for operating at atmospheric pressure. However, the printer 100 may alternatively be adapted for operating at vacuum or ultra-high vacuum.

The printer 100 is normally adapted for operating at temperatures between 10-600° C., such as between 15-450° C., such as between 20-400° C. The printer will normally comprise a heating source heating at least the printer head to allow for it to operate at a requested temperature.

The printer could also be constructed such that it comprises not just one printer head 101 but instead a multiple of printer heads 101. Including multiple printer heads is not a straightforward process when the printer head has micro scale openings, i.e. it is a micronozzle print head. Each of the micronozzle requires special mounting mechanics and micronozzle design. Also, successfully connecting the multiple printer heads to the same gas distributing system is not straightforward.

Figure 3A:
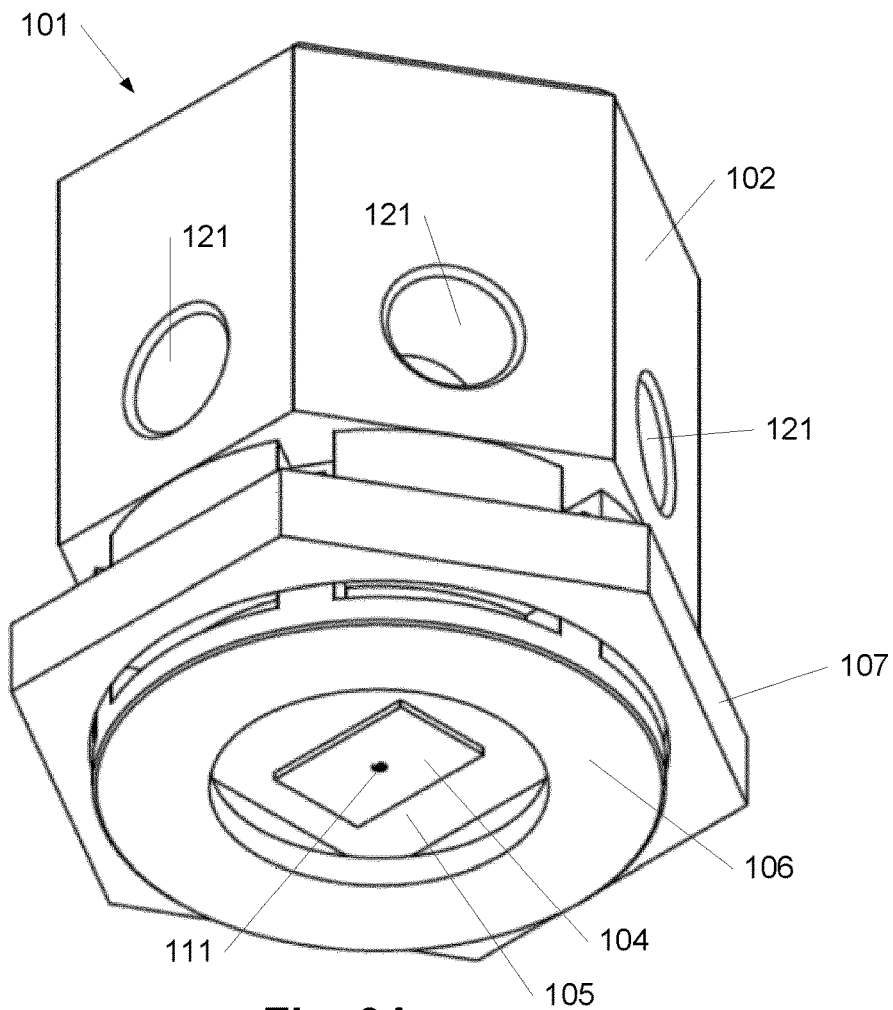
FIGS. 3A-C show an example of a printer head shown in a perspective view (FIG. 3A), a bottom-up view (FIG. 3B), and an exploded view (FIG. 3C).
Figure 3B:
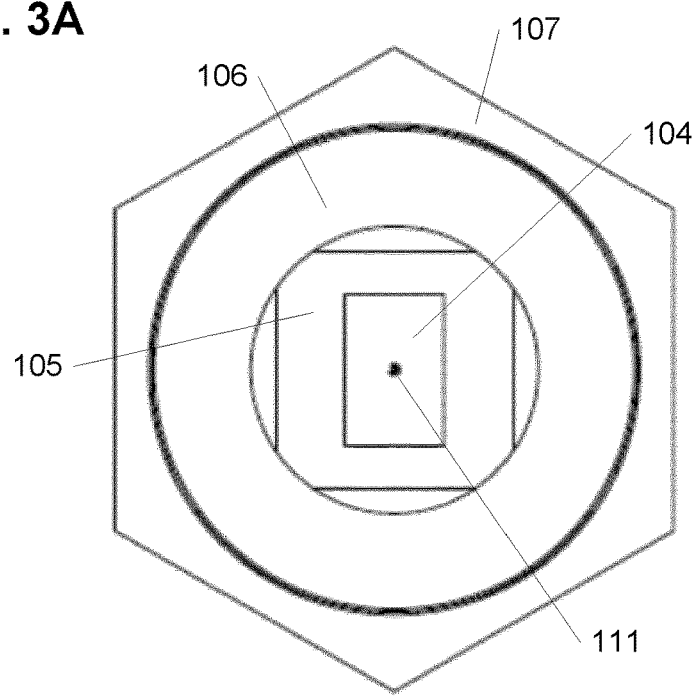
Figure 3C:
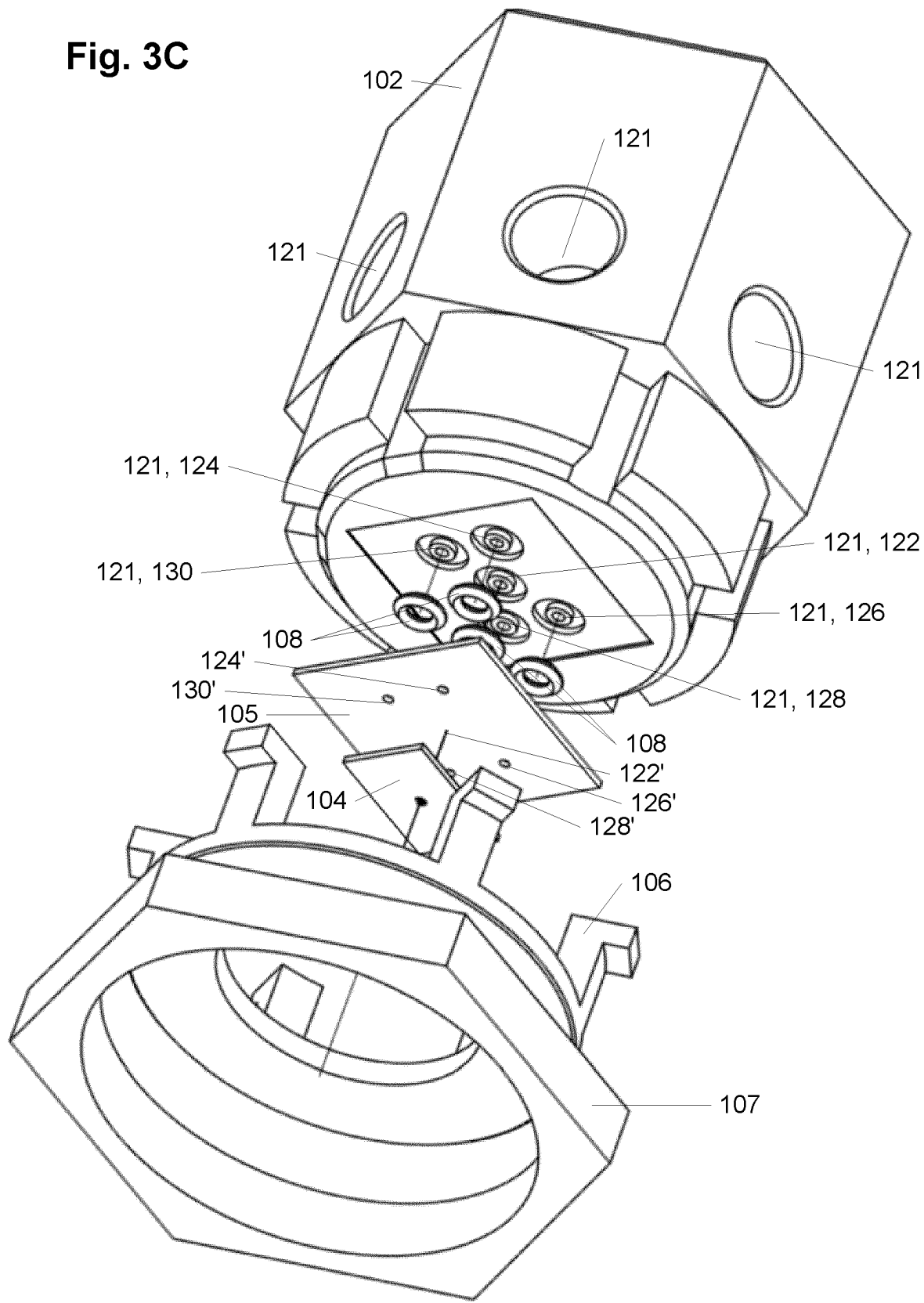

Now referring to FIGS. 3A-C, an example of a printer head 101 is shown in more details in a perspective view (FIG. 3A), a bottom-up view (FIG. 3B), and an exploded view (FIG. 3C). The printer head 101 comprises a printer head body 102 with a number of inlet supply/outlet channels 121, a printer head plate 104 with a number of openings 111, an additional printer head plate 105, a printer head plate clamp 106, and a clamping nut 107.

The printer head plate 104 is connected to the additional printer head plate 105, which in turn is releasably fixed to the printer head plate clamp 106 and the clamping nut 107. The clamping nut 107 and the printer head plate clamp 106 can be separated from the printer head 102, which allows for an easy removal and/or change of printer head plate 104. The clamping nut 107 may be fixed to the printer head body 102 by a screw connection, a bayonet connection, a snap fit connection or similar. The printer head plate 104 is removably attached to the printer head 101 such that different printer head plates 104 can be connected to the printer head 101, the different printer head plates 104 having varying sizes of the opening diameter of the first exit opening. This allows for obtaining different atomic resolutions using the same printer 100.

Alternatively, the printer head plate 104 may simply be soldered to a piece of metal. In this type of setup, there is no need for a clamp.

The inlet supply/outlet channels 121 includes both inlet supply channels 122, 124, 126 and outlet channels 126, 128. FIGS. 4-9 show different example of positions of the openings 111 in the printer head plate 104 with FIG. 4 also showing an example of how the inlet supply channels 122, 124, 126 and outlet channels 126, 128 can be connected to the openings 111 in the printer head plate 104.

Figure 4:
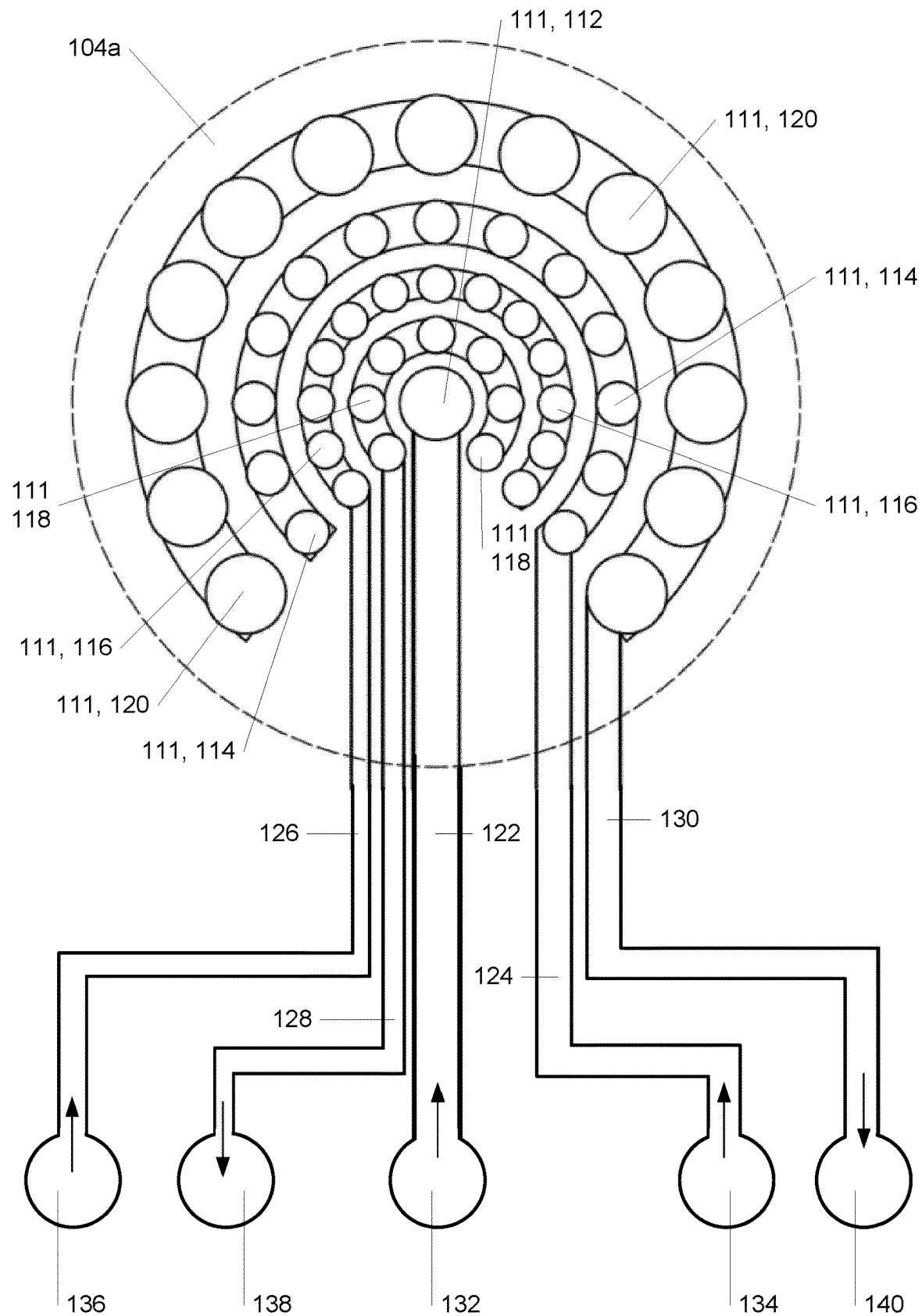
FIG. 4 shows a first example of a printer head plate.

In FIG. 4, a symmetric printer head plate 104a is shown in a close up with an illustration of how the openings 111 are connected to the inlet supply channels 122, 124, 126 and outlet channels 126, 128. The printer head plate 104a in FIG. 4 comprises one centrally positioned first exit opening 112, which has a first exit opening diameter being smaller than 900 micro meters. The first exit opening 112 is connected to a first inlet supply channel 122 for guiding a first precursor fluid 132 onto the substrate 162. The first precursor fluid 132 is shown as being inside a round container in FIG. 4. This is meant only as an illustration of a container for holding the first precursor fluid 132.

The printer head plate 104a in FIG. 4 also comprises a number of second exit openings 114 connected to a second inlet supply channel 124 for guiding a second precursor fluid 134 onto the substrate 162; and a number of third exit openings 116 connected to a third inlet supply channel 126 for guiding an inert fluid 136 onto the substrate 162. Both the second exit openings 114 and the third exit openings 116 are in the example shown in FIG. 4 positioned in concentrically around the first exit opening 112.

Between the first exit opening 112 and the concentrically positioned ring of third exit openings 116 are a ring with a number of concentrically positioned exhaust openings 118, which are connected to a first outlet channel 128. Non-deposited precursor fluids/inert fluid 138 is removed through the number of first exhaust openings 118 connected to the first outlet channel 128. In the example shown in FIG. 5, primarily non-deposited first precursor fluid 132 and inert fluid 136 are removed through the first exhaust openings 118.

Concentrically positioned around the third exit openings 116 are a ring with the number of concentrically positioned second exit openings 114 through which the second precursor fluid 134 is supplied to the substrate 162. Circumferentially positioned around the second exit openings 114 is found a number of second exhaust openings 120 for removing non-deposited second precursor fluid 134, and possibly some of the inert fluid 136.

Though FIG. 4 only shows one example of a printer head plate 104a, often a primary set of exhaust openings 118, 120 will be positioned between each of the first exit openings 112 and a primary set of second exit openings 114; and/or a primary set of third exit openings 116 will be positioned between each of the first exit openings 112 and a primary set of second exit openings 114.

The arrows in the first inlet supply channels 122, 124, 126 and the outlet channels 128, 130 mark the direction in which the fluids flow through the channels 122, 124, 126, 128, 130.

The precursor fluid distance between the first exit opening 112 and the second exit openings 114 will normally be between 5 µm and 3.000 µm, or such as between 5 µm and 500 µm, or such as between 5 µm and 100 µm, or such as between 5 µm and 30 µm, or such as between 10 µm and 20 µm, or such as between 30 µm and 3.000 µm, or such as between 50 µm and 2.000 µm, or such as between 100 µm and 1000 µm.

Having a relatively large distance between the first exit opening 112 and second exit openings 114 prevents mixture of the two precursor fluids 132, 134 at the same time. Thus, having an exhaust opening distance between the first exhaust openings 118 and the second exhaust openings 120 above 50 µm prevents mixture of the two precursor fluids in the exhaust openings 118, 120. On the other hand, when there is an exhaust opening distance between the first exhaust opening 118 and the second exhaust openings 120 of less than 50 µm mixture of the two precursor fluids in the exhaust openings 118, 120 is normally observed.

As shown in FIG. 3C, the printer head 101 may further comprise an additional printer head plate 105 positioned between the printer head plate 104 and the inlet channels 122, 124, 126. The additional printer head plate 105 comprises a number of openings 122', 124', 126' 128, 130' each connected to/part of the supply channels 122, 124, 126, 128, 130. O-rings 108 will normally be found between the additional printer head plate 105 and the printer head body 102 for ensuring a tight connection.

Figure 3D:
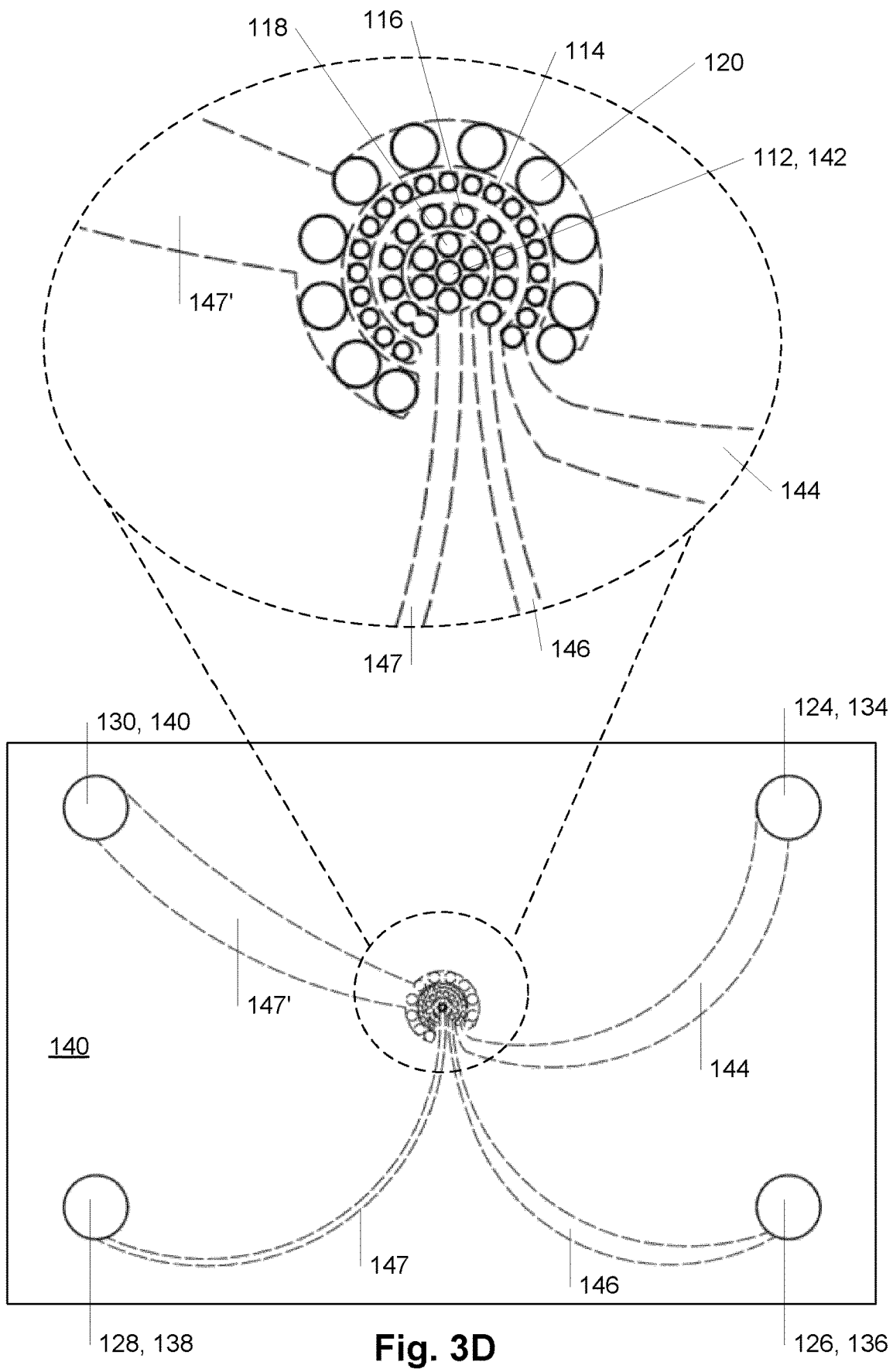
FIG. 3D shows an example of distribution channels inside a printer head plate.

FIG. 3D shows the distribution channels inside the printer head plate 104. The distribution channels includes one or more first distribution channels 142 adapted for guiding the first precursor fluid 132 from the first inlet supply channel 122 to the first exit opening 112. The distribution channels inside the printer head plate 104 also includes one or more second distribution channels 144 adapted for distributing the second precursor fluid 134 from the second inlet supply channel 124 to the one or more second exit openings 114, and one or more third distribution channels 146 adapted for distributing the inert fluid 136 from the third inlet supply channel 126 to the one or more third exit openings 116. The distribution channels inside the printer head plate 104 further includes more one or more exhaust distribution channels 147, 147' adapted for removing precursor fluids 132, 134 and inert fluid 136.

Figure 5:
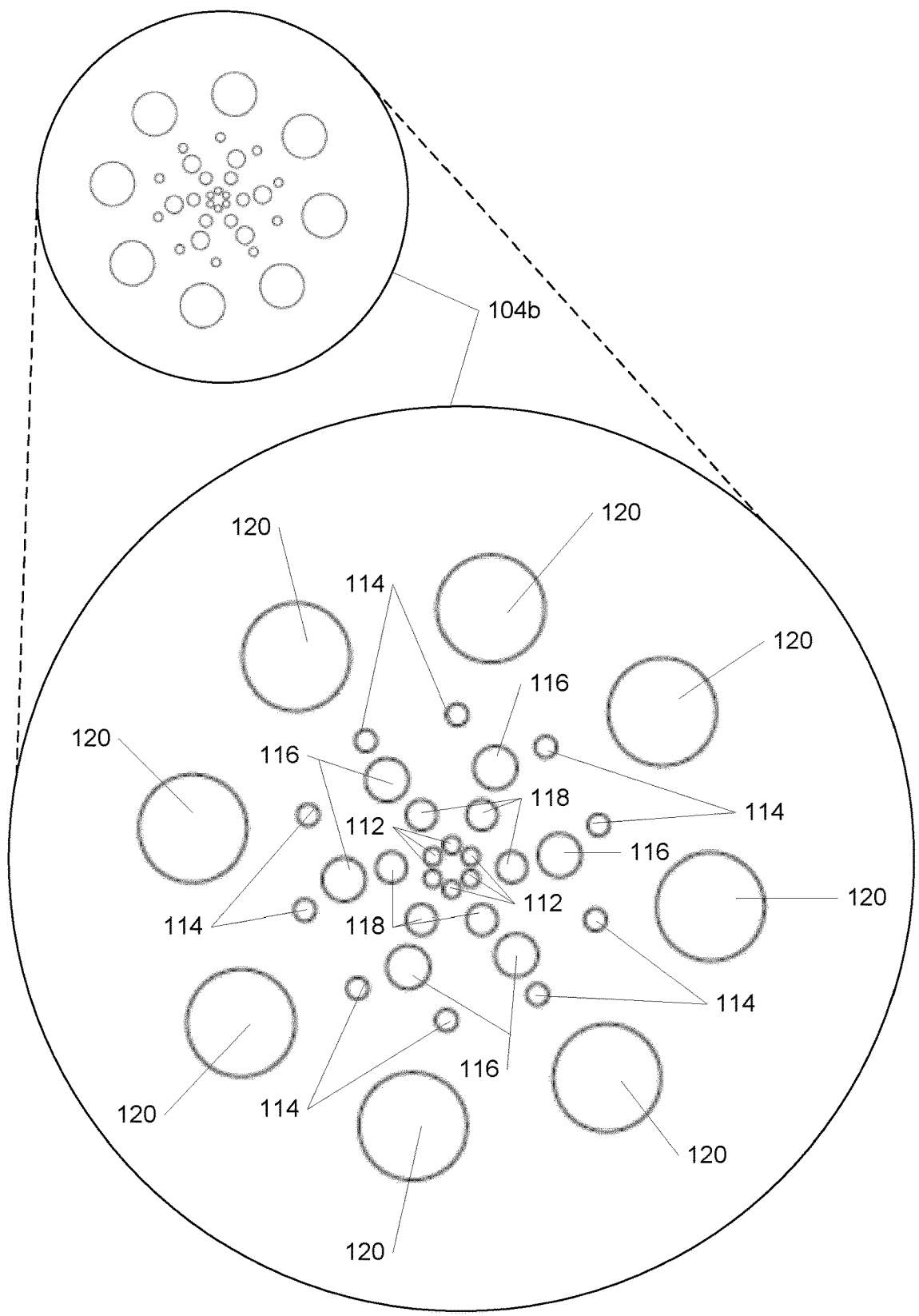
FIG. 5 shows a second example of a printer head plate.

FIG. 5 shows another example of a close-up view of a printer head plate 104b, where there are a multiple of first exit openings 112. To provide the viewer with a more clear view of the printer head plate 104b, a small version of the plate is shown in the top left corner without reference signs. In the printer head plate 104b shown in FIG. 5, there are six first exit openings 112 positioned in the center of the printer head plate 104b. Surrounding the first exit openings 112 are a set of first exhaust openings 118, which again is surrounded by a set of third exit openings 116 followed by a set of second exit openings 114 and a set of second exhaust openings 120. Compared to the printer head plate 104a of FIG. 4, the circumferential order of exit openings 112, 114, 116 and exhaust openings 118, 120 are the same. The number of exit openings 112, 114, 116 and exhaust openings 118, 120 in each ring set are however different and the individual distance between the openings 112, 114, 116, 118, 120 in the same ring differ. Also, the size of the openings 112, 114, 116, 118, 120 differ. The size of the first exit openings 112 are like the ones shown in FIG. 4, smaller than 900 μm in diameter.

Figure 6:
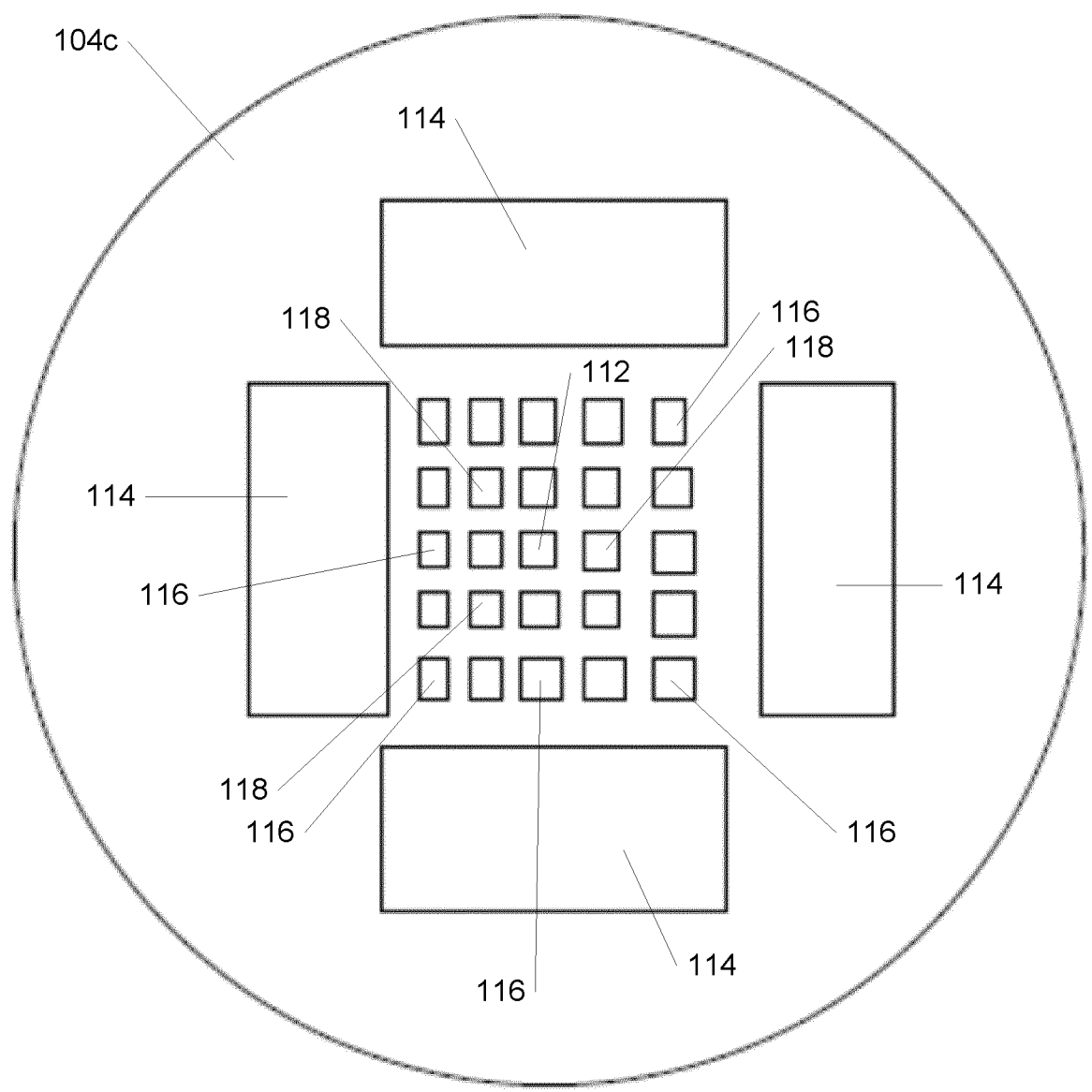
FIG. 6 shows a third example of a printer head plate.

FIG. 6 shows yet another example of a close-up view of a partly symmetrical printer head plate 104c, where there are square shaped openings 112, 114, 116, 118. In this example, there are only one type of exhaust openings 118 for removing both non-deposited first precursor fluid 132 and non-deposited second precursor fluid 134 as well as inert fluid 136. There is again only one first exit opening 112. Surrounding the first exit opening 112 is a set of first exhaust openings 118, which again is surrounded by a set of third exit openings 116 followed by a set of second exit openings 114. Compared to the printer head plates 104a, 104b of FIGS. 4 and 5, the openings 114, 116, 118 are positioned in squares around the first exit opening 112. Though the shape of the openings 112, 114, 116, 118, 120 in FIG. 6 differ from the circular shapes in FIGS. 4 and 5, the size of the first exit opening 112 is still smaller than 900 μm from one corner to an opposite corner.

Figure 7:
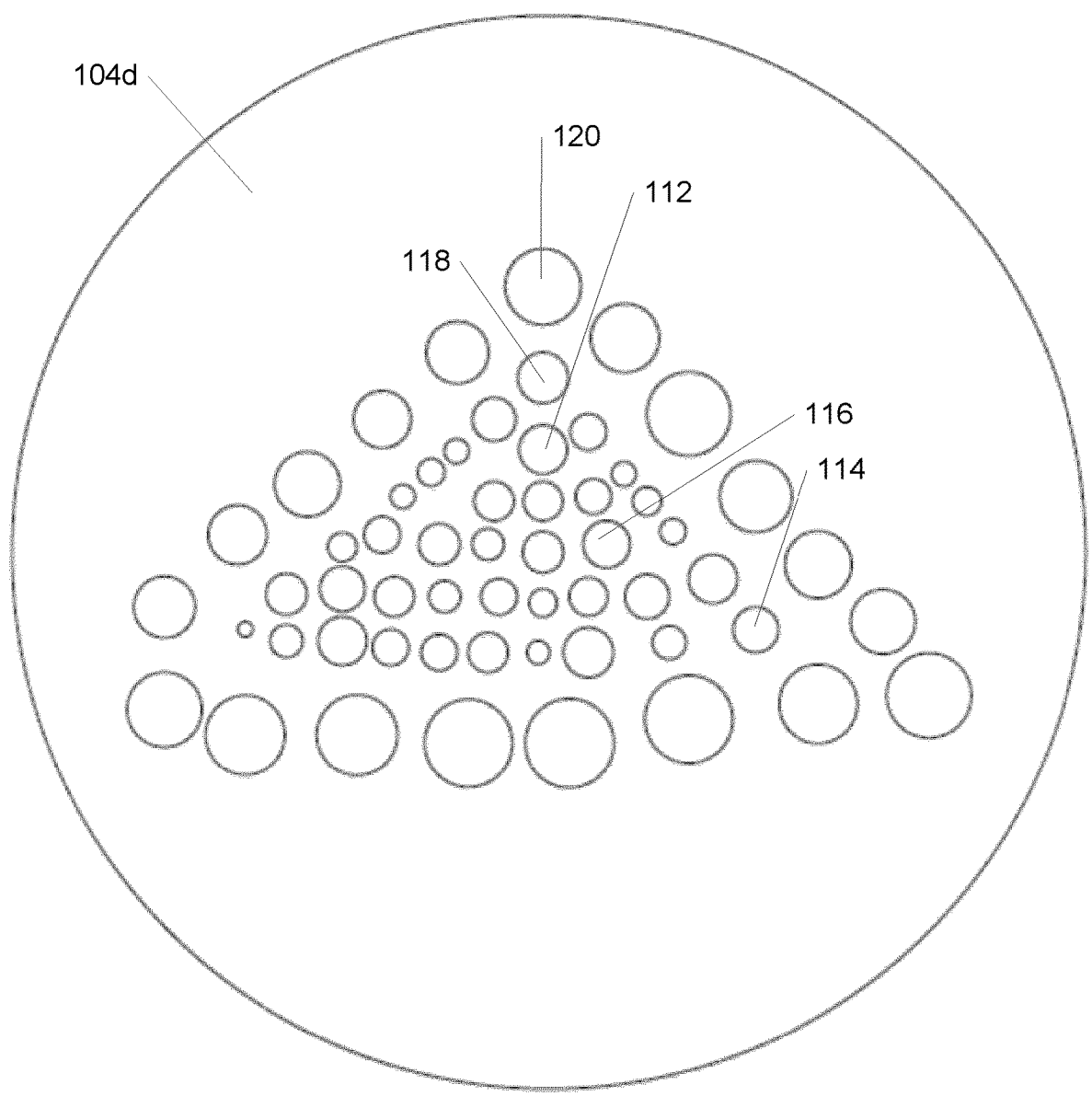
FIG. 7 shows a fourth example of a printer head plate.

The printer head plates 104a, 104b, 104c shown in FIGS. 4, 5, and 6 all have a symmetrical positioning of the openings 112, 114, 116, 118, 120, at least to some degree. Non-symmetrical configuration may, however, also be used. FIG. 7 shows an example of a close-up view of a non-symmetrical printer head plate 104d, openings 112, 114, 116, 118, 120 are positioned randomly. The lack of reference numbering for some of the openings are meant to illustrate that different options are possible in terms of which type of opening 112, 114, 116, 118, 120 the different circles are.

Figure 8:
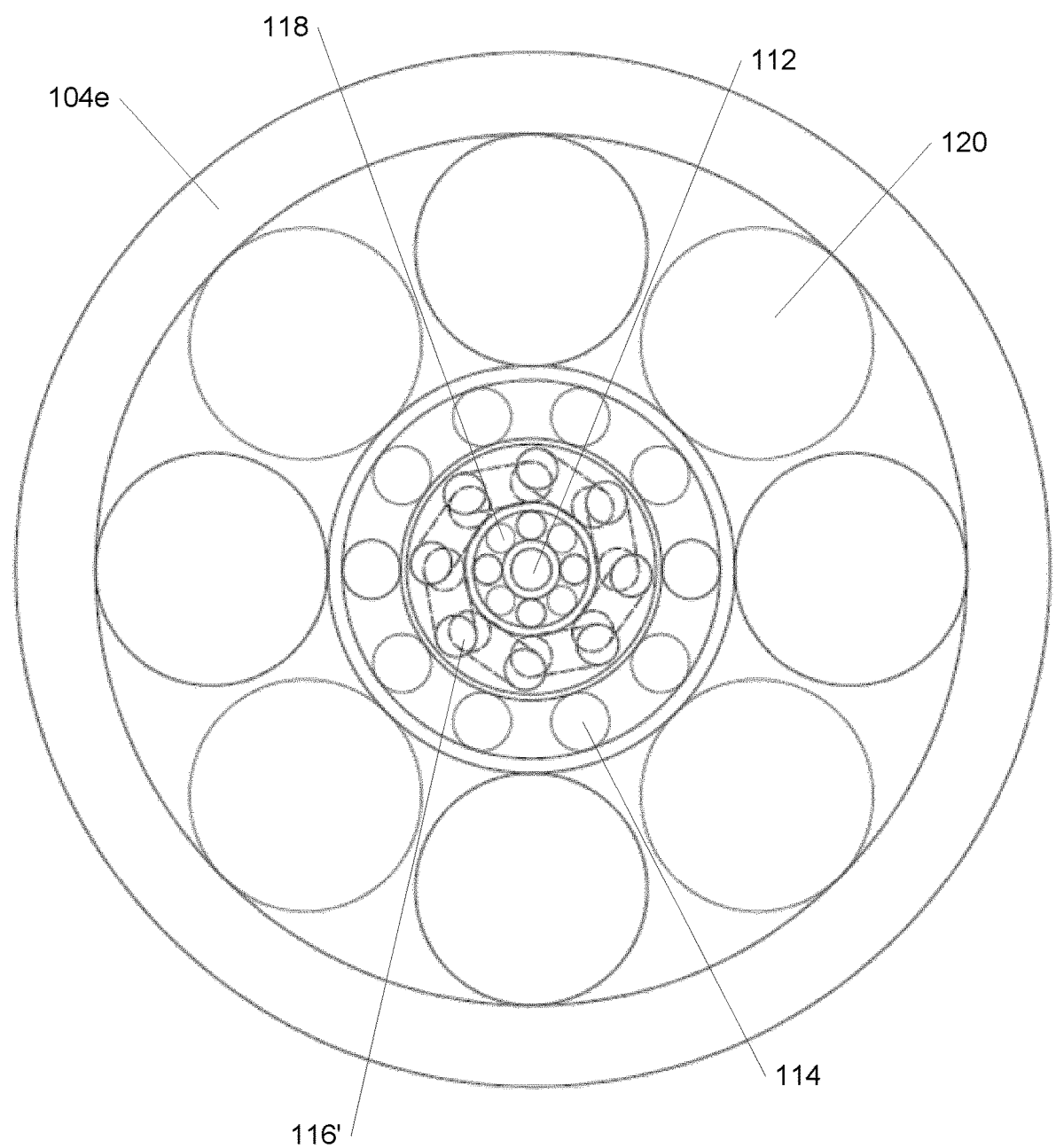
FIG. 8 shows a fifth example of a printer head plate.

FIG. 8 shows an example of a close-up view of a printer head plate 104e somewhat resembling that in FIG. 4 with the difference that the third exit openings 116' are with an angle offset.

Figure 9:
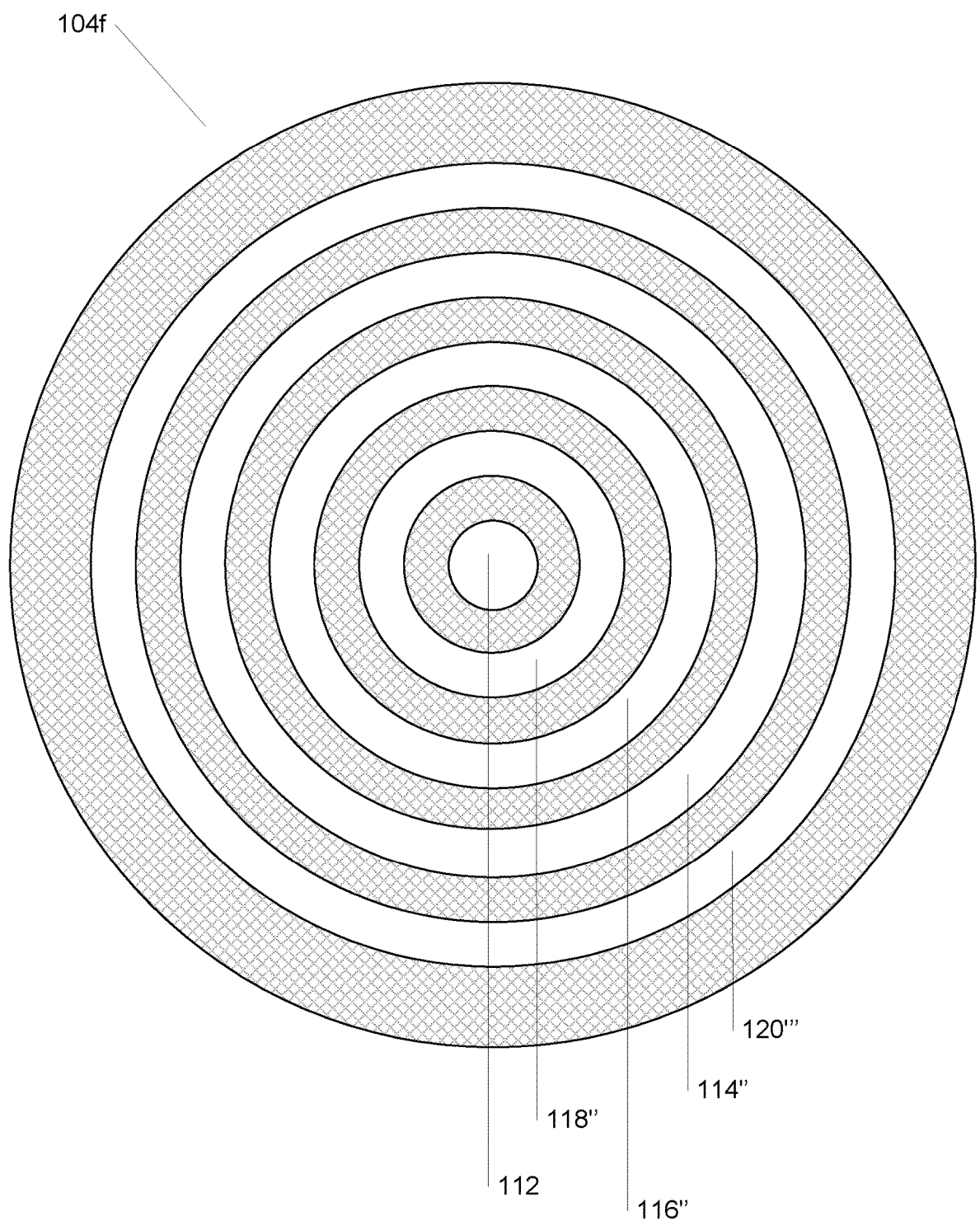
FIG. 9 shows a sixth example of a printer head plate.

FIG. 9 shows an example of a close-up view of a printer head plate 104f wherein the second exit opening 114", third exit opening 116", the first exhaust opening 118", and the second exhaust opening 120" are ring-shaped. The printer head plate 104f in FIG. 9 somewhat resembles that in FIG. 4 with the difference that the multiple of second exit openings 114, the third exit openings 116, the first exhaust openings 118, and the second exhaust openings 120 each arranged in a concentric setup around the first exit opening 112 in FIG. 4 are combined into one large ring-shaped opening for each of the second exit opening 114", the third exit opening 116", the first exhaust opening 118", and the second exhaust opening 120".

The first exit opening diameter of all first exit openings 112 in all the shown examples of printer heads 104a, 104b, 104c, 104d, 104e, 104f in FIGS. 4-9 are smaller than 900 μm. In one or more examples, the first exit opening diameter is smaller than 800 μm, such as smaller than 700 μm, such as smaller than 600 μm, such as smaller than 500 μm, such as smaller than 400 μm, such as smaller than 300 μm, such as smaller than 200 μm, such as smaller than 100 μm, such as smaller than 50 μm.

In one or more examples, the first exit opening diameter is in a range of 0.005-850 μm, such as 0.005-750 μm, such as 0.005-650 μm, such as 0.005-550 μm, such as 0.005-450 μm, such as 0.005-250 μm, such as 0.005-100 μm, such as 0.01-50 μm, such as 0.01-10 μm, such as 0.01-1 μm, such as 0.015-0.05 μm, such as 0.02 μm.

The printer will normally be able to provide a pattern resolution of 20 nm-1 mm. The resolution of the printed structure, i.e. the resolution size, may depend on both the diameter of the one or more first exit openings and the distance between the printer head and the substrate plate, as e.g. shown below in Table 1.

TABLE 1

Selected size of the first exit opening, the distance between the printer head and the substrate plate and the lateral resolution obtained in the printed structures.

| Lateral resolution | Diameter of the first opening | Distance between the sample and the opening in the printer head |
|---|---|---|
| 100 μm-1 mm | 80-800 μm | 100 μm |
| 10-100 um | 8-80 μm | 10-100 μm |
| 1-10 μm | 800 nm-8 um | 1-10 μm |
| 100 nm-1 μm | 80 nm-800 nm | 100-1000 nm |

The printer head 101 may comprise a safety evacuation channel positioned outermost around the openings 112, 114, 116, 118 on the printer head plates 104a, 104b, 104c, 104d, 104e, 104f. The outermost exhaust openings, e.g. the second exhaust openings 120 may serve as the safety evacuation channel.

The printer head 101 outlet surface may be in the form of a disc, a square, a rectangle, a triangle, a pentangle, or similar with the sets of opening each forms a circular discs. By outlet surface may be meant both the printer head plates 104 or the additional printer head plate 105. Overall, the shape is irrelevant as long as the printer head plate(s) 104, 110 are easily fixed and/or released from to the printer 101.

The printer 100 may be used for spatial type ALD as described above in connection with the figures, where there are a number of exit openings 112, 114, 116 for each of the precursor fluids 132, 134 and the inert fluid 136. This corresponds to the first aspect of the printer 100 as disclosed herein.

Disclosed herein is also a method for material deposition on a substrate 162 in a selective area according to the fourth aspect. The method comprising the steps of:

providing an atomic layer process printer with a substrate plate 160 and a printer head 101 positioned opposite each other,
  wherein the substrate plate 160 is movable in relation to the printer head 101:
    along an axis in an X,Y plane defined by an X axis and an Y axis being perpendicular in relation to each other;
    along a Z axis being perpendicular to the X,Y plane; and
    at a first angle φ defining a rotation of the X,Y plane around the Z axis;
  wherein substrate plate 160 and the printer head 101 are movable in relation to each other at a second angle θ defining a tilting of the X,Y plane around an axis in the X,Y plane;
positioning a substrate 162 on the substrate plate 160;
exposing the substrate 162 to a first precursor fluid 132 through one or more first exit openings 112 each having a diameter smaller than 900 micro meters;
removing the first precursor fluid 132 not deposited on the substrate 162 by means of one or more exhaust openings 118, 120 in combination with exposing the substrate 162 to an inert fluid 136;
exposing the substrate 162 with the first precursor deposited thereon to a second precursor fluid 134;
removing the second precursor fluid 134 not deposited on the substrate 162 by means of the one or more exhaust openings 118, 120 in combination with exposing the substrate 162 to an inert fluid 136.

In one or more examples, the substrate plate 160 and the printer head 101 are moved in relation to each other between the depositing of the precursor fluids 132, 134.

As described in the second and fifth aspect, the printer 100 may be configured for supplying the precursor fluids 132, 134 and the inert fluid 136 to the substrate 162 through the same exit openings 112, 114, 116, at least including the first exit opening(s) 112, in an alternating manner. An could be using the sequence of the first precursor fluid 132, followed by the inert fluid 136 and then the second precursor fluid 134. This corresponds to the temporal type ALD as shown in FIG. 1A. The printer head plates of FIGS. 4-9 can be used for this setup. The only difference when using the printer 100 in this mode compared to the spatial type mode is that the supply channel 122, 124, 126 need to be connected to all the openings 112, 114, 116. Further, to obtain a high resolution using the printer according to the second aspect, the exit opening diameters all need to be smaller than 900 μm in diameter.

Disclosed herein is further a method for vertical material deposition on a substrate 162 in a selective area according to the fifth aspect. The method comprising the steps of:
  providing an atomic layer process printer with a substrate plate 160 and a printer head 101 positioned opposite each other, wherein the substrate plate 160 and the printer head 101 are movable in relation to each other in one or more of:
    along an axis in an X,Y plane defined by an X axis and an Y axis being perpendicular in relation to each other;
    along a Z axis being perpendicular to the X,Y plane; and
    at a first angle φ defining a rotation of the X,Y plane around the Z axis;
  wherein substrate plate 160 and the printer head 101 are movable in relation to each other at a second angle θ defining a tilting of the X,Y plane around an axis in the X,Y plane;
  positioning a substrate 162 on the substrate plate 160;
  exposing the substrate 162 to a first precursor fluid 132 through one or more first exit openings 112 each having a diameter smaller than 900 micro meters;
  removing the first precursor fluid 132 not deposited on the substrate 162 by means of one or more exhaust openings 118, 120 in combination with exposing the substrate 162 to an inert fluid 136 through the one or more first exit openings 112;
  exposing the substrate 162 with the first precursor deposited thereon to a second precursor fluid 134 through the one or more first exit openings 112;
  removing the second precursor fluid 134 not deposited on the substrate 162 by means of the one or more exhaust openings 118, 120 in combination with exposing the substrate 162 to an inert fluid 136 through the one or more first exit openings 112.

Further, by having a chamber surrounding the substrate 162, the second precursor fluid 134 may not need to be supplied to the substrate 162 through the second exit opening 114 using the second inlet supply channel 124. This corresponds to the third aspect as described above.

Alternatively, the precursor fluids 132, 134 may be mixed before being supplied to the substrate 162. This aspect is a build on onto the third aspect. Disclosed herein is therefore also in a sixth aspect a method for rapid material deposition on a substrate 162 in a selective area, wherein the method comprises the steps of:
  providing an atomic layer process printer with a substrate plate 160 and a printer head 101 positioned opposite each other, wherein the substrate plate 160 is movable in relation to the printer head 101:
    along an axis in an X,Y plane defined by an X axis and an Y axis being perpendicular in relation to each other;
    along a Z axis being perpendicular to the X,Y plane; and
    at a first angle φ defining a rotation of the X,Y plane around the Z axis;
  wherein substrate plate 160 and the printer head 101 are movable in relation to each other at a second angle θ defining a tilting of the X,Y plane around an axis in the X,Y plane;
  positioning a substrate 162 on the substrate plate 160;
  mixing a first precursor fluid 132 and a second precursor fluid 134;
  exposing the substrate 162 to the mixture of the first precursor fluid 132 and the second precursor fluid 134 through one or more first exit openings 112 each having a diameter smaller than 900 micro meters.

The printer 100 may not only be used for rapid material deposition on a substrate 162 in a selective area, but also for etching. Disclosed herein in a seventh aspect is therefore also a method for material etching on a substrate 162 in a selective area, wherein the method comprises the steps of:
  providing an atomic layer process printer with a substrate plate 160 and a printer head 101 positioned opposite each other, wherein the substrate plate 160 is movable in relation to and the printer head 101:
    along an axis in an X,Y plane defined by an X axis and an Y axis being perpendicular in relation to each other;
    along a Z axis being perpendicular to the X,Y plane;
    at a first angle φ defining a rotation of the X,Y plane around the Z axis;
  wherein substrate plate 160 and the printer head 101 are movable in relation to each other at a second angle θ defining a tilting of the X,Y plane around an axis in the X,Y plane;
  positioning a substrate 162 on the substrate plate 160;
  exposing the substrate 162 to a first etching agent through one or more first exit openings 112 each having a diameter smaller than 900 micro meters;
  removing the first etching agent not deposited on the substrate 162 by means of one or more exhaust openings 118, 120 in combination with exposing the substrate 162 to an inert fluid 136 through the one or more first exit openings 112;
  exposing the substrate 162 with the first precursor deposited thereon to a second etching agent through the one or more first exit openings 112;
  removing the second etching agent not deposited on the substrate 162 by means of the one or more exhaust openings 118, 120 in combination with exposing the substrate 162 to an inert fluid 136 through the one or more first exit openings 112.

In the printer according to the method of the fourth-seventh aspect the one or more exhaust openings may include:

- one or more first exhaust openings 118 connected to a first outlet channel 128 for removing non-deposited first precursor fluid 132, and possibly inert fluid 136, from the substrate 162; and
- one or more second exhaust openings 120 connected to a second outlet channel 130 for removing non-deposited second precursor fluid 134, and possibly inert fluid 136, from the substrate 162.

Figure 10:
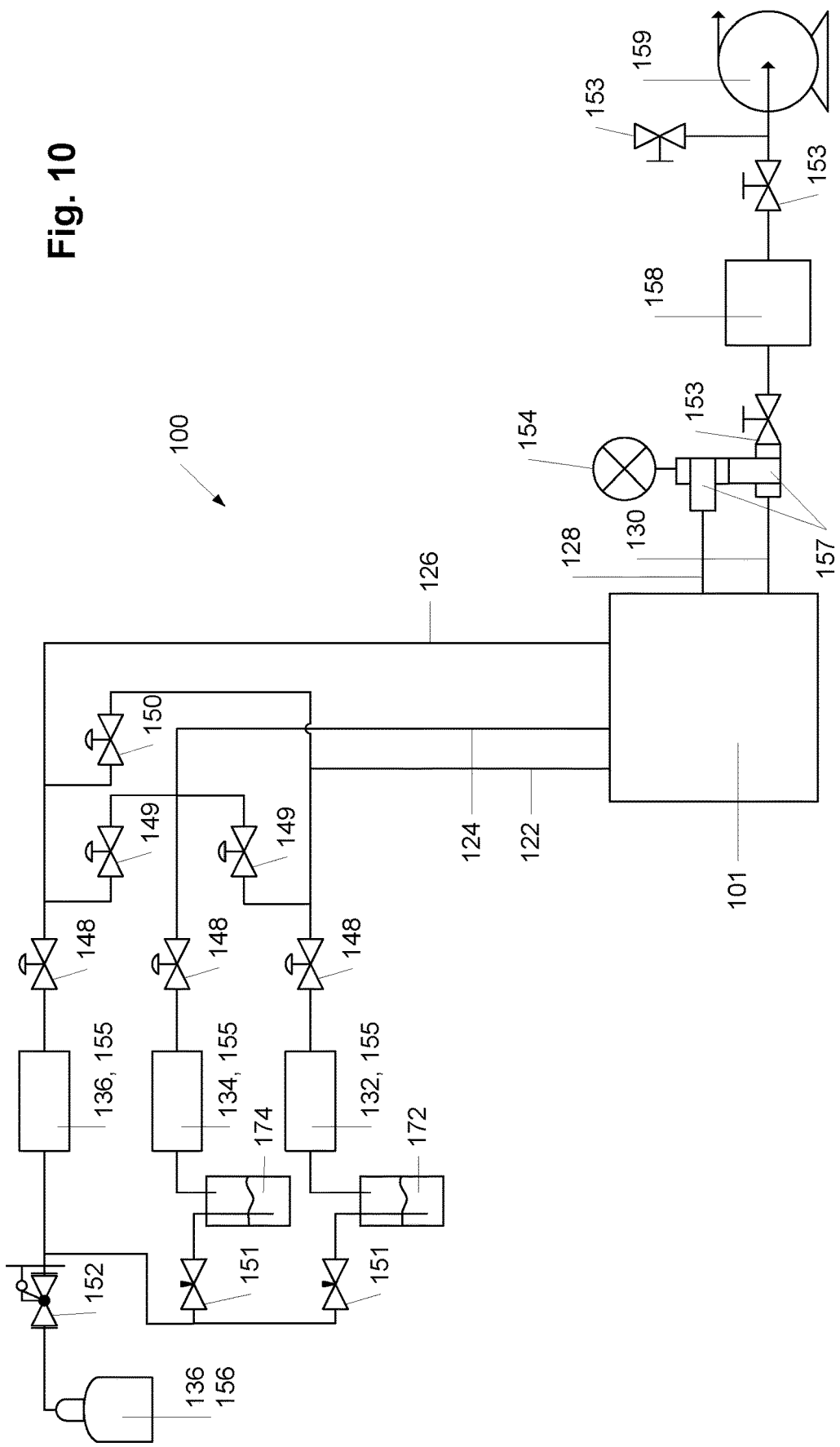
FIG. 10 shows an example of a printer, which can be controlled for switching between the spatial and the temporal ALD type process.

An example of a printer 100, which can be controlled such that switching between the spatial and the temporal ALD type process including both material deposition, etching and cleaning is shown in FIG. 10.

The precursor fluids 132, 134 and the inert fluid 136 is shown as gases in FIG. 10 controlled by flow controllers 155, which may open proportionally, measure the flow, and provide feedback signals. The controllers 155 are normally computer controlled. The precursor fluids 132, 134 are obtained from bubbling an inert gas 136 from a container 156 through a first precursor solution 172 and a second precursor solution 174 for obtaining the first precursor gas 132 and the second precursor gas 134, respectively.

The supply channels 122, 124, 126 for supplying the first precursor fluid 132, the second precursor fluid 134, and the inert fluid 136 to the substrate 162 are controlled by a number of first set of valves 148.

The printer 100 also comprises a second set of valves 149 for cleaning the supply channels 122, 124, 126 with the inert fluid 136. The printer 100 additionally comprises a third valve 150, which allows for using the printer 100 in the temporal ALD mode, as it can send the second precursor fluid 134 through the first supply channel 122 onto the substrate 162, and likewise send the first precursor fluid 132 through the second supply channel 124 onto the substrate 162. Thus, by controlling the valves 148, 149, 150 individually, e.g. by switching them on and off, the precursor fluids 132, 134 and the inert fluid 136 can be supplied to the printer head 101 and onto the substrate 162 as described above for all aspects of the printer 100. The valves 148, 149, 150 will normally be diaphragm vacuum valve. The valves may be controlled in a number of different manners, e.g. pneumatically.

The inert gas 136 is supplied to the first precursor solution 172 and the second precursor solution 174 through a fourth set of valves 151. The valves 151 may be needle valves, which adjusts the bubblers.

The printer further comprises a fifth valve 152, which is a pressure reducing for controlling the inert fluid 136 supply. The fifth valve 152 is the inert fluid 136 distributor, and it allows the printer 100 to operate the spatial ALD mode and temporal ALD mode.

The exhaust channels 128, 130 are controlled by a standard vacuum system comprising a sixth set of valves 153, a pressure sensor 154, connectors 157 (e.g. T-shaped connectors), a trap 158 acting as a filter for a pump 159, and the pump 159.

In the following are described examples of printed structures obtained using the printer according to the first aspect.

Figure 11:
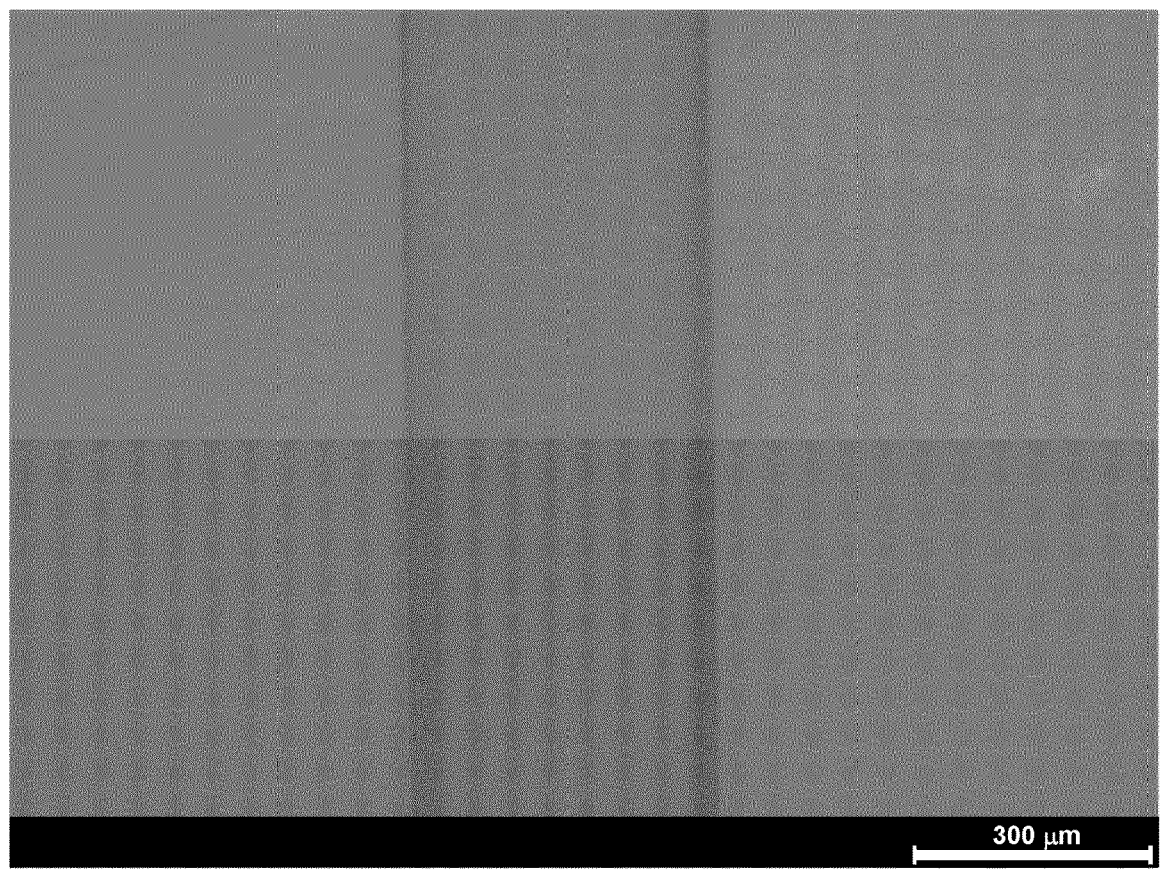
In FIG. 11 is shown a SEM top view of a $TiO_2$ printed line obtained using the printer.

In FIG. 11 is shown a SEM top view of a printed line. The material printed is $TiO_2$. The lateral resolution is approximately 320 micrometres and the thickness approximately 30 nanometres. The diameter of first exist opening is 80 μm. The distance between the printer head and the sample of is 50 μm. The temperature of the printer head is 100° C., the temperature of the substrate is 150° C., the temperature of the tubing is at 90° C., and the precursor source is set at a temperature of 60° C.

Figure 12:
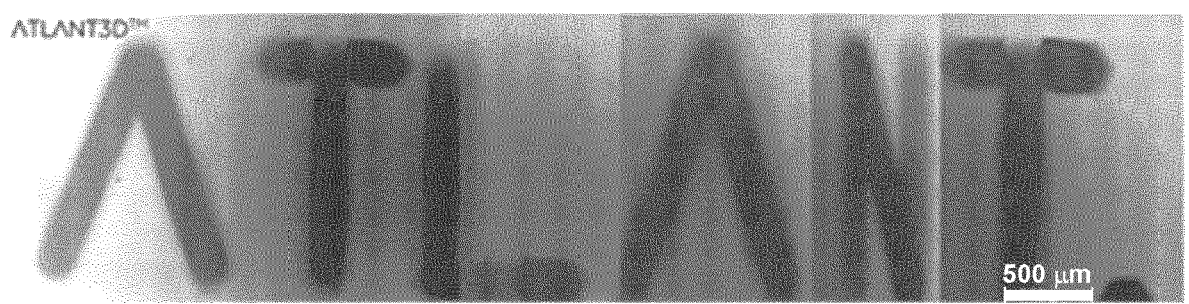
FIG. 12 shows a complex printed pattern of amorphous $TiO_2$ deposited using the printer.

FIG. 12 shows a complex printed pattern of amorphous $TiO_2$ deposited at a printer head, where the diameter of first exist opening is 80 μm. The printed pattern shows a resolution of 15 nm. The distance between the printer head and the sample of is 50 μm. The temperature of the printer head is 100° C., the temperature of the substrate is 150° C., the temperature of the tubing is at 90° C., and the precursor source is set at a temperature of 60° C.

Figure 13A:
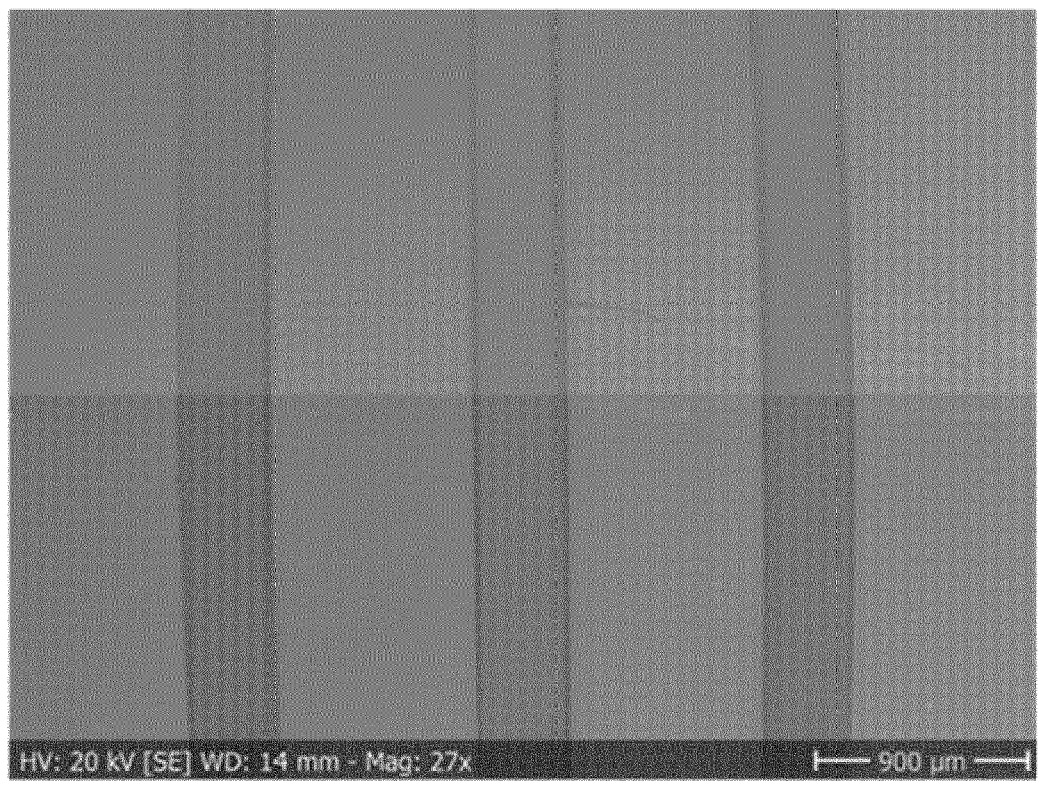
FIG. 13A shows an Energy-dispersive X-ray spectroscopy of printed Platinum lines using the printer.
Figure 13B:
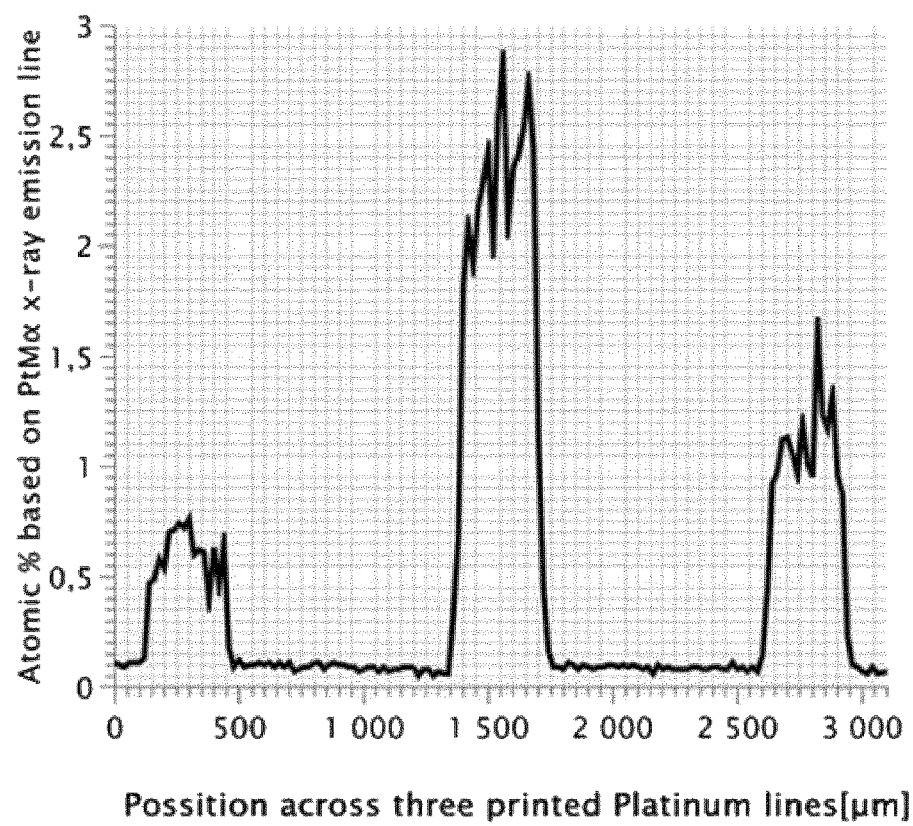
FIG. 13B shows a signal strength obtained.

FIG. 13A shows an Energy-dispersive X-ray spectroscopy of printed Platinum lines using the printer. The Signal is showing the presence of platinum clearly. The signal strength shown in FIG. 13B is related to different line thickness. Three different thicknesses are intentionally produced (thinnest, thickest, and between). The diameter of first exist opening is 80 μm. The distance between the printer head and the sample of is 50 μm. The temperature of the printer head is 100° C., the temperature of the substrate is 250° C., the temperature of the tubing is at 90° C., and the precursor source is set at a temperature of 60° C.

Figure 14:
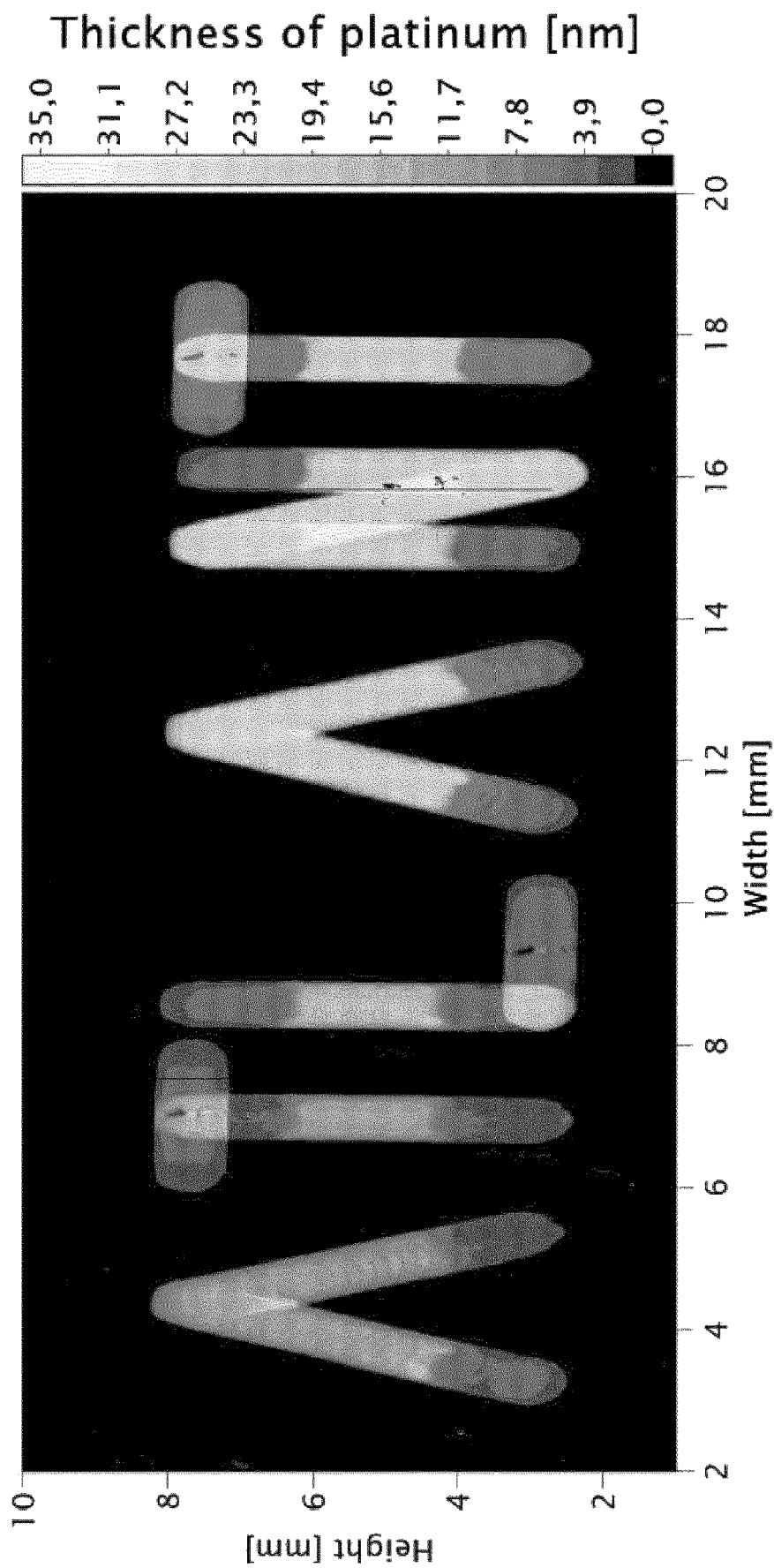
FIG. 14 shows a complex printed pattern of amorphous Pt deposited using the printer.

FIG. 14 is a complex printed pattern of platinum. The diameter of first exist opening is 80 μm. The distance between the printer head and the sample of is 50 μm. The temperature of the printer head is 100° C., the temperature of the substrate is 250° C., the temperature of the tubing is at 90° C., and the precursor source is set at a temperature of 60° C.

Figure 15A:
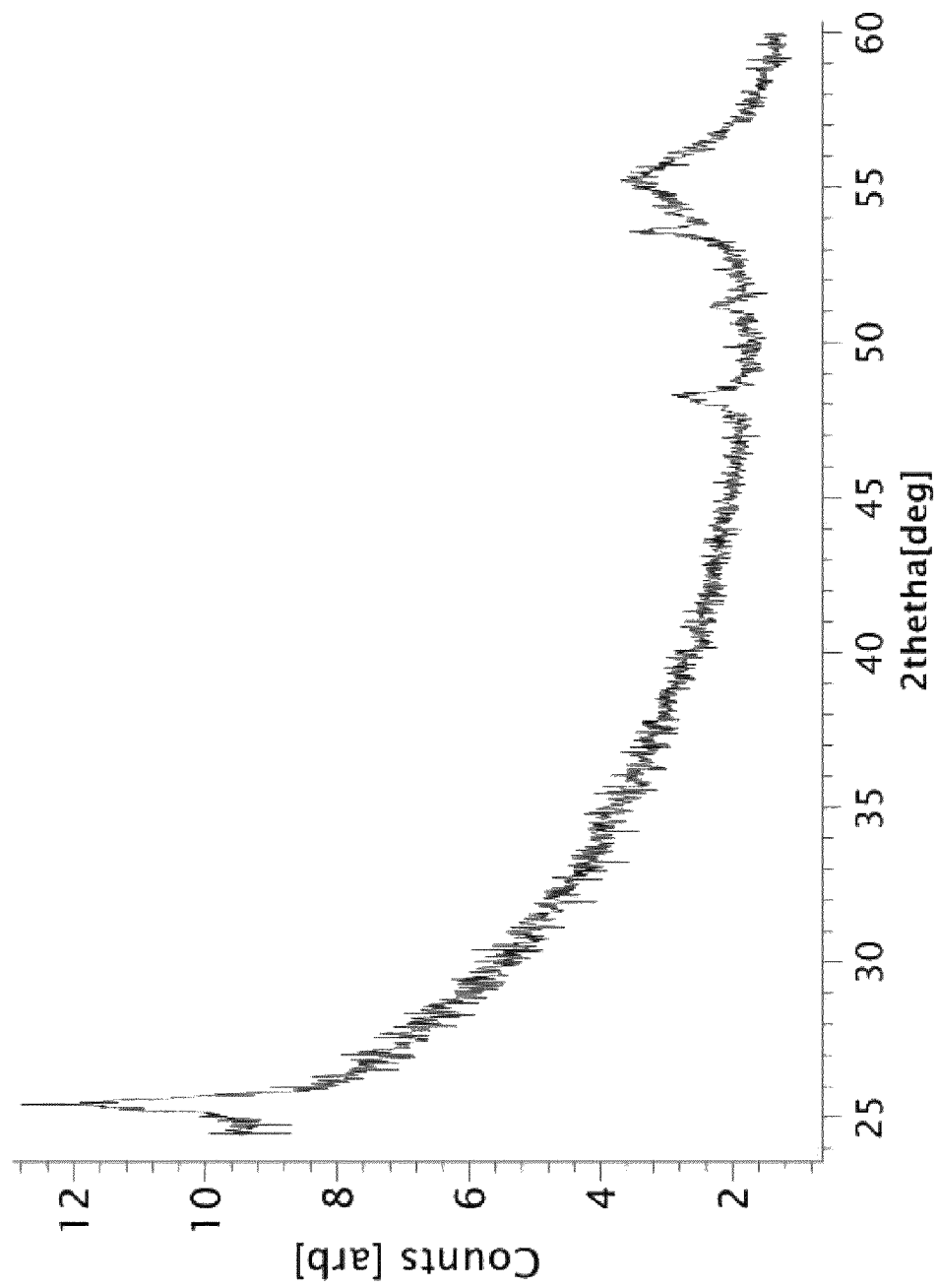
FIGS. 15A and 15B show X-ray diffraction patterns of deposited materials using the printer.
Figure 15B:
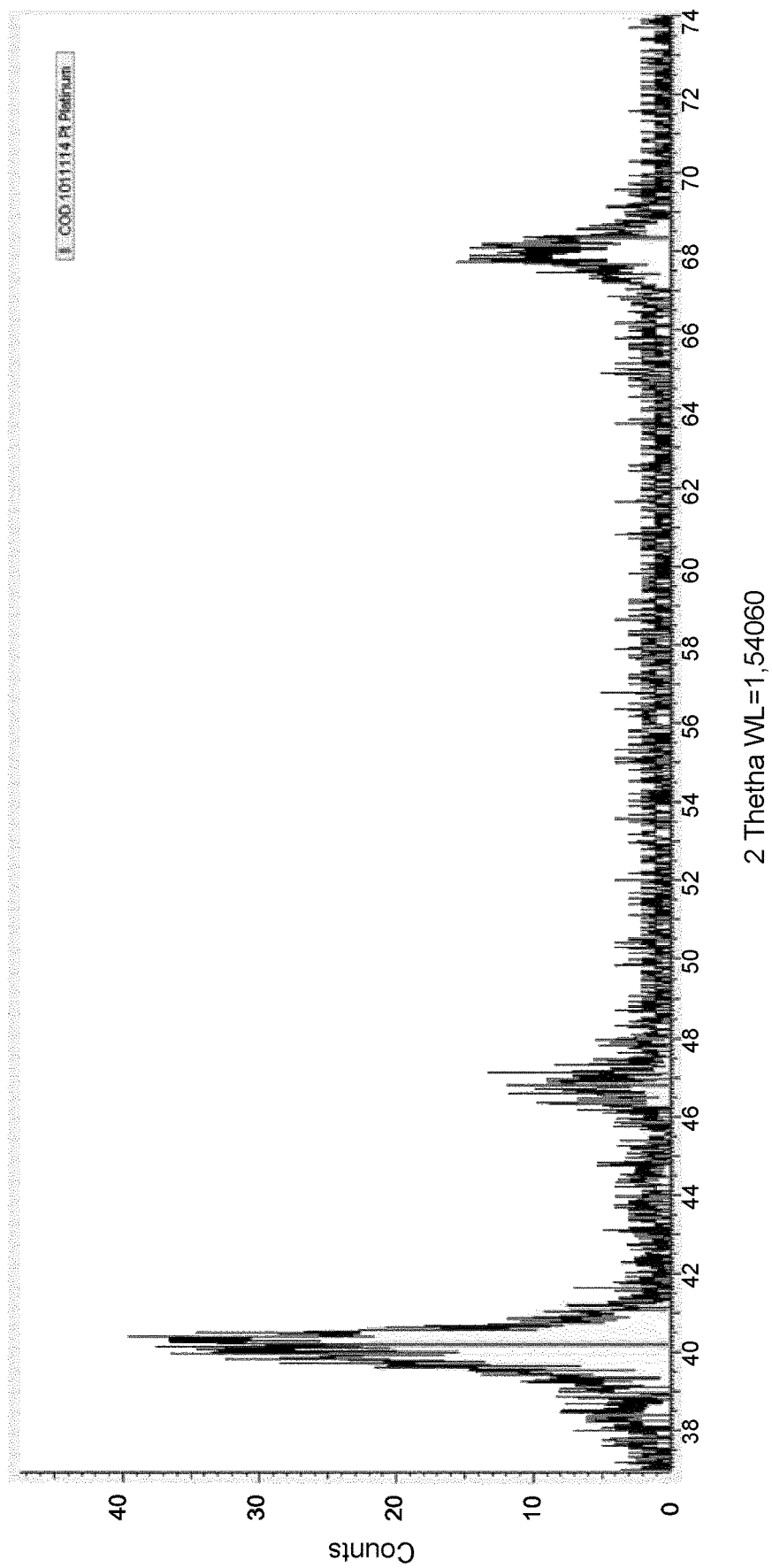

FIGS. 15A and 15B show X-ray diffraction patterns of deposited materials, where FIG. 15A is anatase $TiO_2$ line pattern deposited using a printer head temperature of 275 degrees C., and FIG. 15B is a Platinum line pattern. The diameter of first exist opening is 80 μm. The distance between the printer head and the sample of is 50 μm. The temperature of the printer head is 100° C., the temperature of the substrate is 250° C., the temperature of the tubing is at 90° C., and the precursor source is set at a temperature of 60° C.

Figure 16:
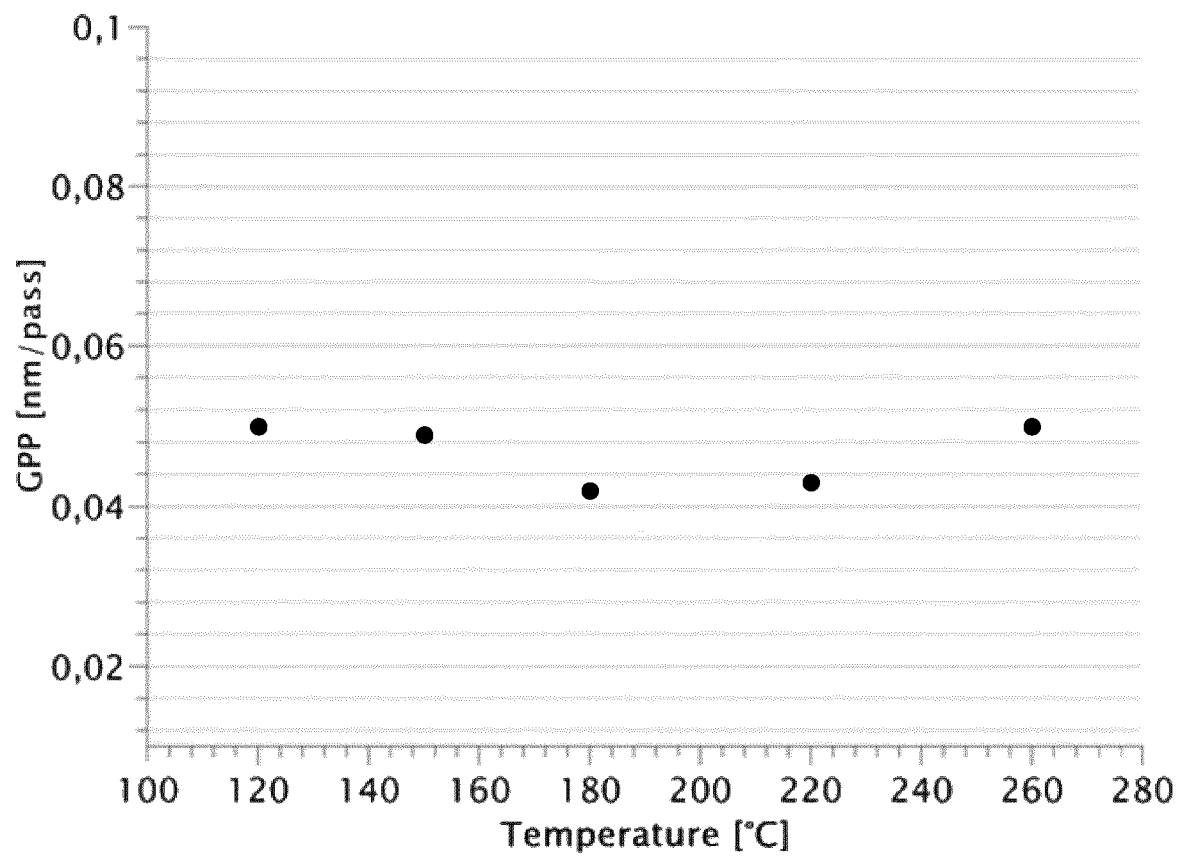
FIG. 16 shows the dependence of growth on temperature for the $TiO_2$ deposition using the printer.

FIG. 16 shows the dependence of growth on temperature for the $TiO_2$ deposition using TTIP and $H_2O$. In the margining of error, there is no temperature dependence showing that the deposition is stable in this temperature region as expected. The diameter of first exist opening is 80 μm. The distance between the printer head and the sample of is 50 μm. The temperature of the printer head is 100° C., the temperature of the substrate varies, the temperature of the tubing is at 90° C., and the precursor source is set at a temperature of 60° C.

Figure 17:
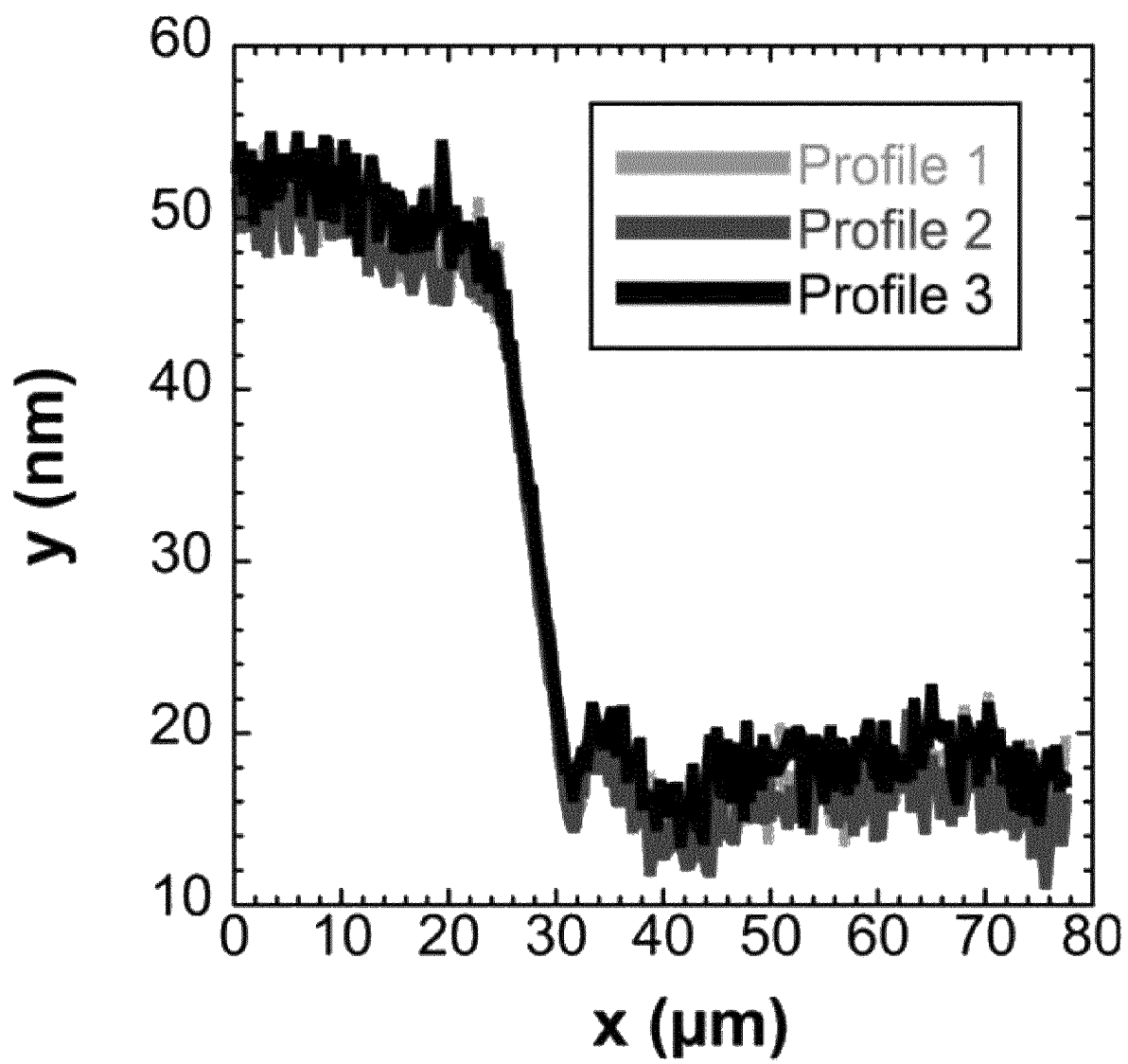
FIG. 17 shows an atomic force microscopy profile of a $TiO_2$ line deposited using the printer.

FIG. 17 shows an atomic force microscopy profile of a $TiO_2$ line deposited. The three profiles shown in FIG. 17 shows the geometry of edges of the printed lines. The diameter of first exist opening is 80 μm. The distance between the printer head and the sample of is 50 μm. The temperature of the printer head is 100° C., the temperature of the substrate is 150° C., the temperature of the tubing is at 90° C., and the precursor source is set at a temperature of 60° C.

Figure 18A:
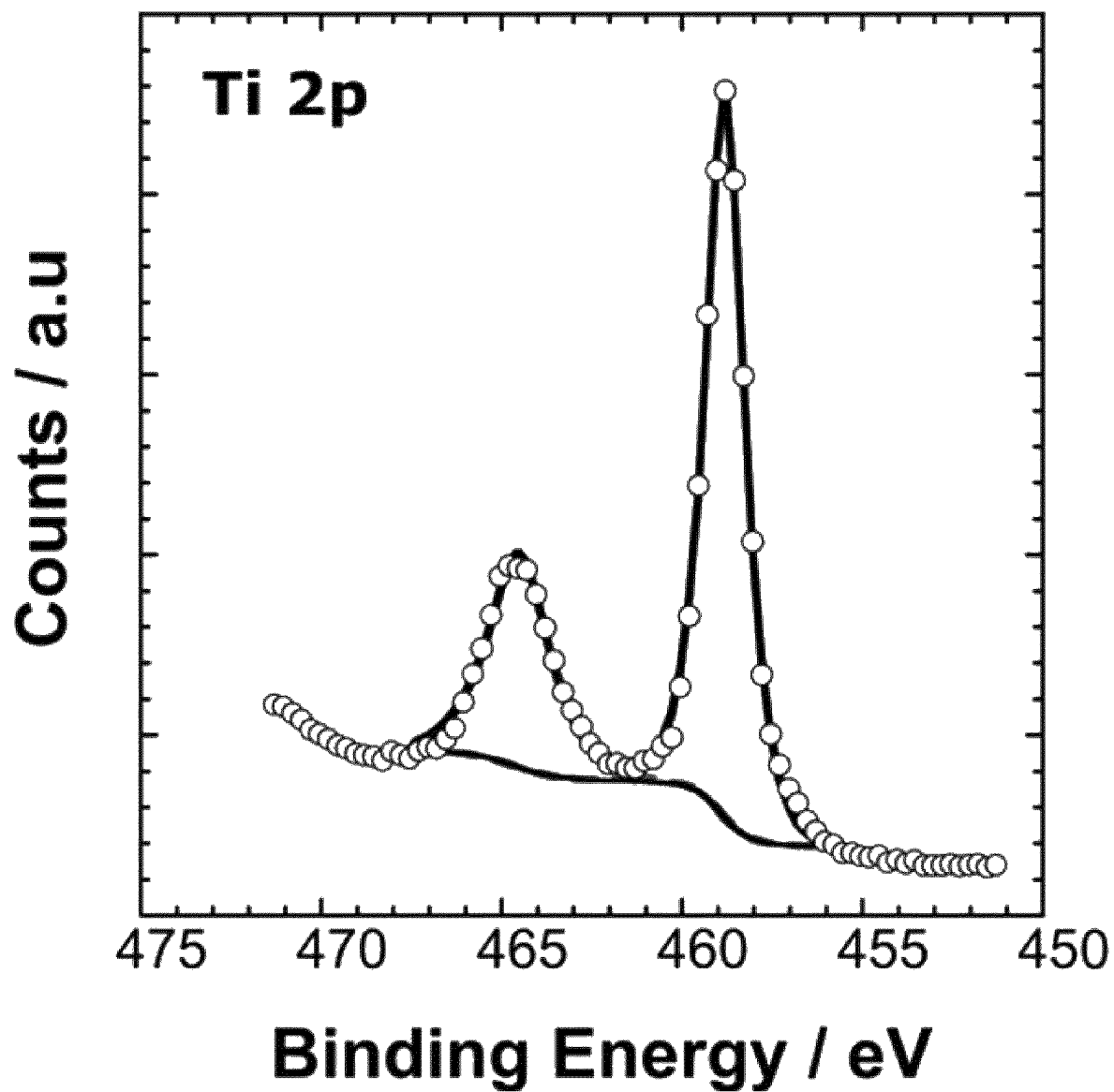
FIG. 18a shows an X-ray photoelectron spectra of $TiO_2$ deposited using the printer, and FIG. 18b show an X-ray photoelectron spectra of $PtO_2$ deposited using the printer.

FIG. 18a shows an X-ray photoelectron spectra of $TiO_2$ deposited using a printer, where the temperature of the printer head is 100° C., the temperature of the substrate is 150° C., the temperature of the tubing is at 90° C., and the precursor source is set at a temperature of 60° C. The peaks are corresponding to $TiO_2$ visible. The diameter of first exist opening is 80 μm. The distance between the printer head and the sample of is 50 μm.

Figure 18B:
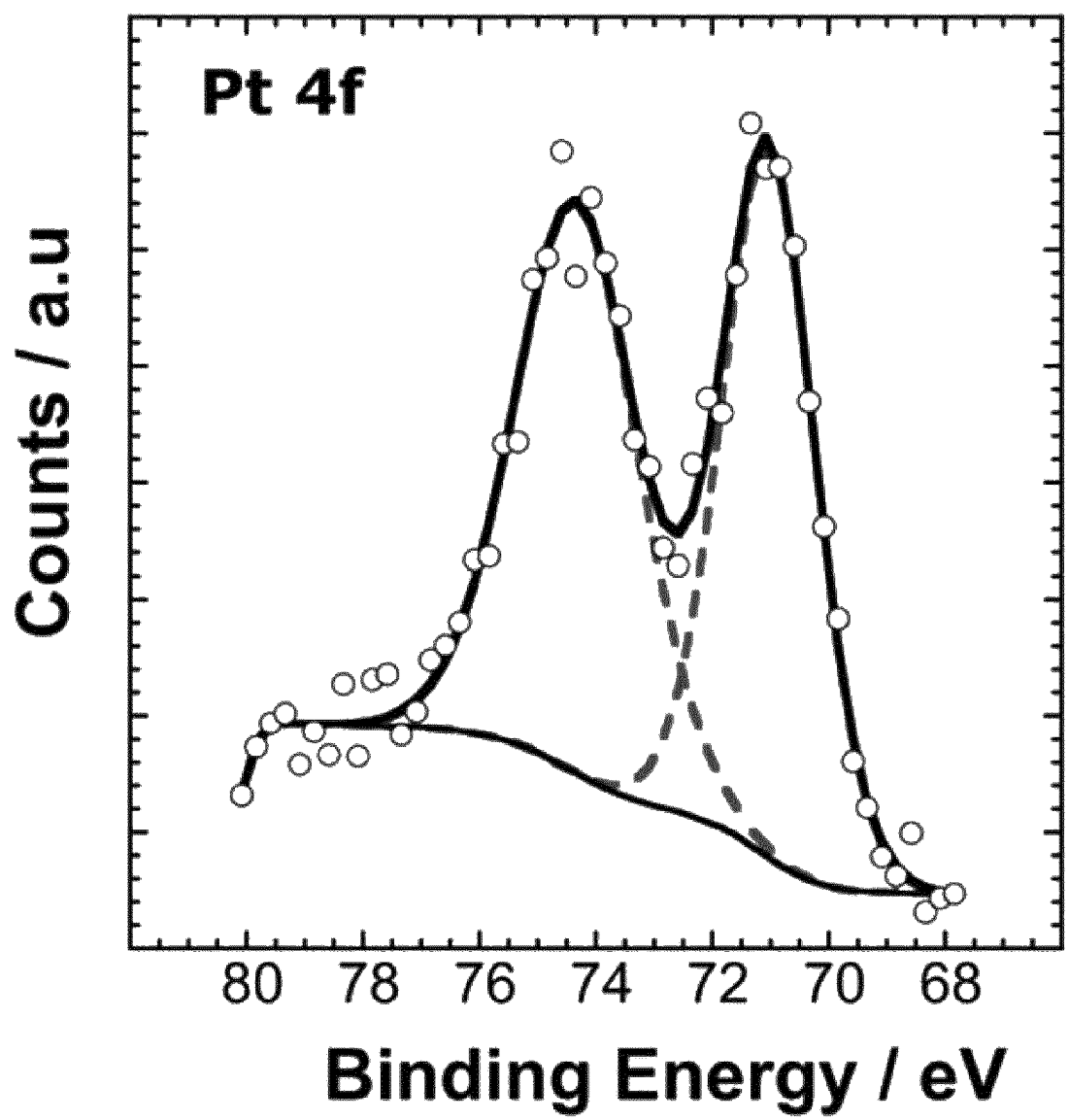

FIG. 18b shows an X-ray photoelectron spectra of $PtO_2$ deposited using a printer, where the temperature of the printer head is 100° C., the temperature of the substrate is 150° C., the temperature of the tubing is at 90° C., and the precursor source is set at a temperature of 60° C. The peaks are corresponding to PtO$_2$ visible. The diameter of first exist opening is 80 μm. The distance between the printer head and the sample of is 50 μm.

Figure 19A:
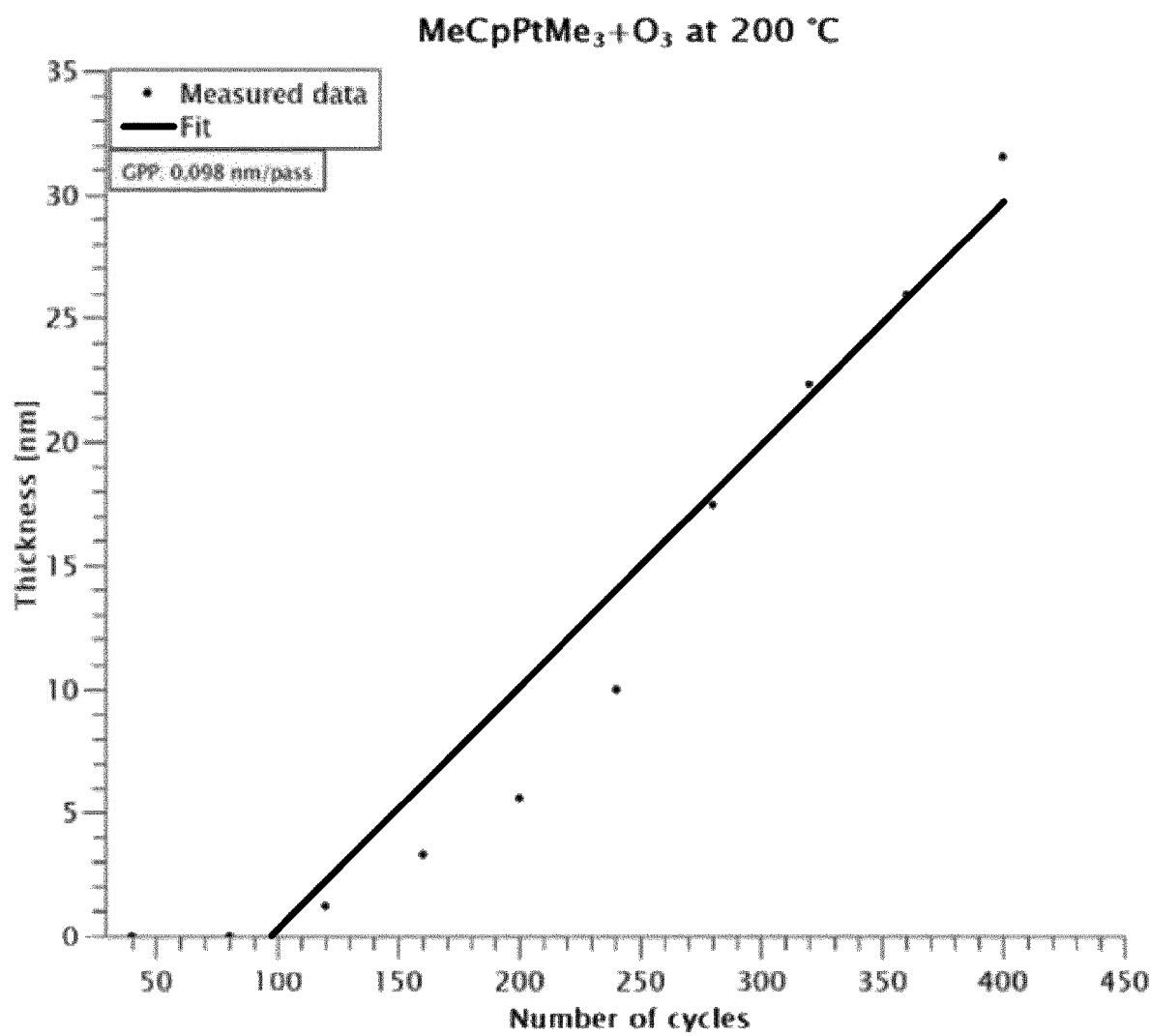
FIGS. 19a-C show measured growth curves of platinum at different substrate temperatures.
Figure 19B:
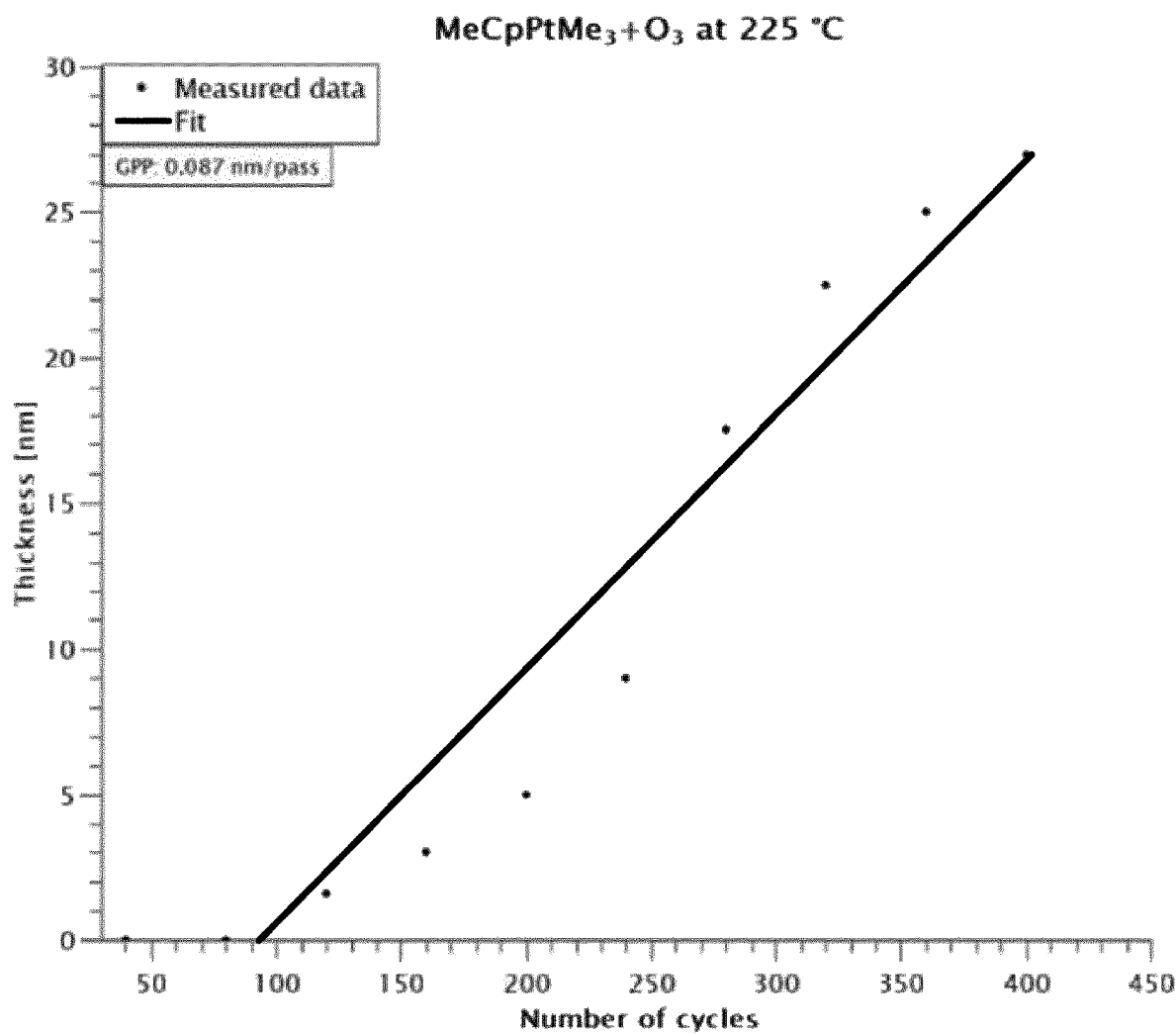
Figure 19C:
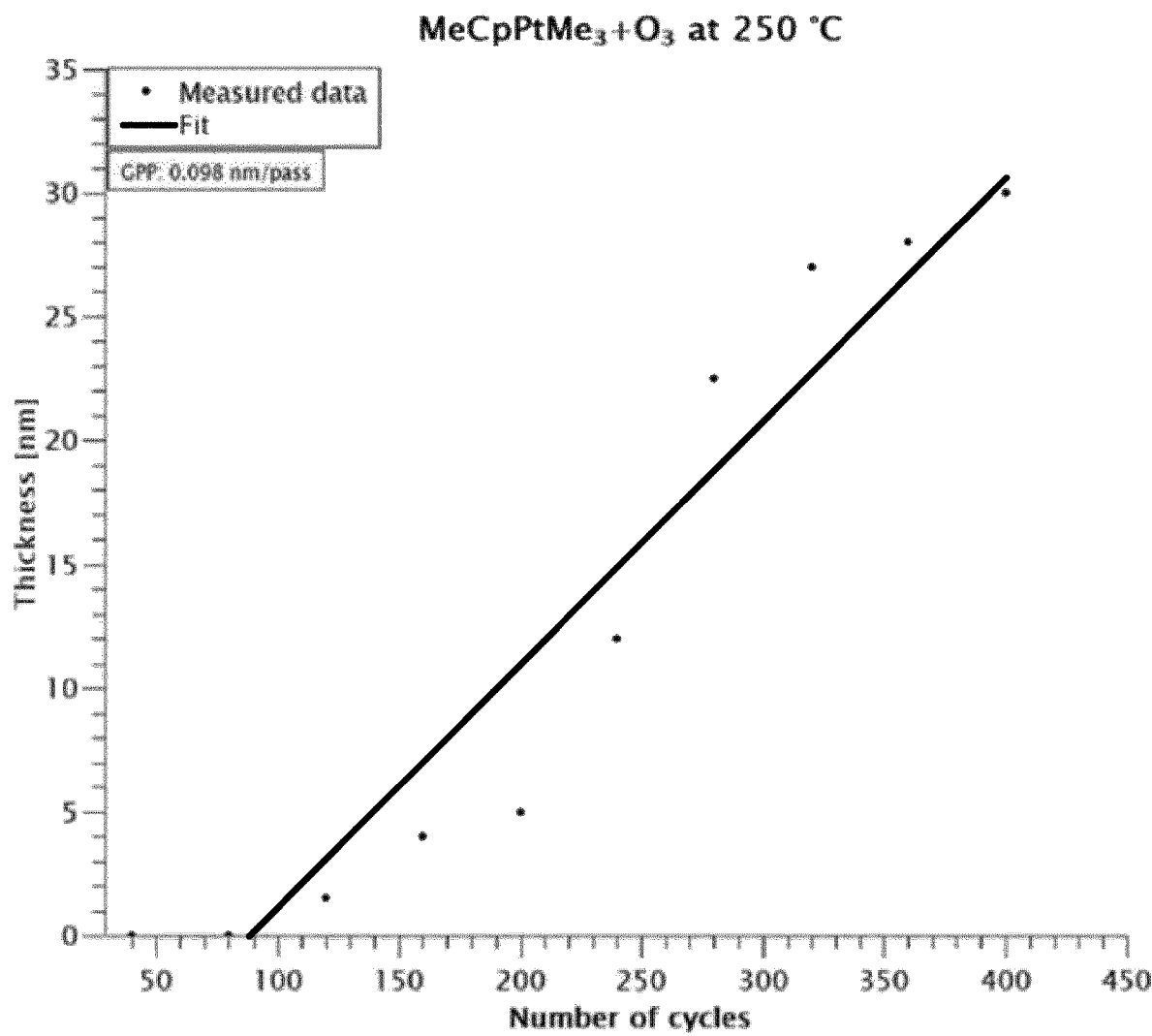

FIGS. 19a-c show measured growth curves of platinum using a printer, where the diameter of first exist opening is 80 μm. The distance between the printer head and the sample of is 50 μm. The temperature of the printer head is 100° C., the temperature of the substrate is 200° C. in FIG. 19a, 225° C. in FIG. 19b, and 250° C. in FIG. 19c. The temperature of the tubing is at 90° C., and the precursor source is set at a temperature of 60° C.

REFERENCES 100 printer
101 printer head
102 printer head body
104 printer head plate
104a first example of the printer head plate
104b second example of the printer head plate
104c third example of the printer head plate
104d fourth example of the printer head plate
104e fifth example of the printer head plate
105 additional printer head plate
106 printer head plate clamp
107 clamping nut
108 O-ring
111 openings in the printer head plate
112 first exit opening
114 second exit opening
114" ring-shaped second exit opening
116 third exit opening
116' third exit opening with an angle offset
116" ring-shaped third exit opening
118 first exhaust opening
118" ring-shaped first exhaust opening
120 second exhaust opening
120" ring-shaped second exhaust opening
121 inlet supply/outlet channel
122 first inlet supply channel
122' opening connected to/part of the first inlet supply channel
124 second inlet supply channel
124' opening connected to/part of the second inlet supply channel
126 third inlet supply channel
126' opening connected to/part of the third inlet supply channel
128 first outlet channel
128' opening connected to/part of the first outlet channel
130 second outlet channel
130' opening connected to/part of the second outlet channel
132 first precursor fluid
134 second precursor fluid
136 inert fluid
138 non deposited precursor fluids/inert gas
140 non deposited precursor fluids/inert gas
142 first distribution channel
144 second distribution channel
146 third distribution channel
147 exhaust distribution channel
147' exhaust distribution channel
148 first set of valves
149 second set of valves
150 third valve
151 fourth set of valves
152 fifth valve
153 sixth set of valves
154 pressure sensor
155 controller
156 container with an inert gas
157 connector
158 trap acting as a filter
159 pump
160 substrate plate
162 substrate on the substrate plate
172 first precursor solution
174 second precursor solution
X X axis in the X,Y plane
Y Y axis in the X,Y plane
Z Z axis perpendicular to the X,Y plane
φ angle defining a rotation of the X,Y plane around the Z axis
θ angle defining a tilting of the X,Y plane around an axis in the X,Y plane

What is claimed is:

1. An Atomic Layer Process Printer for material deposition, etching and/or cleaning on an atomic scale in a selective area, the printer comprising:
a substrate plate for holding a substrate where onto one or more fluids are deposable using the printer;
a printer head positioned opposite the substrate on the substrate plate, wherein the printer head comprises a printer head plate with a number of openings including:
one or more first exit openings each having a first exit opening diameter being smaller than 900 micro meters;
one or more second exit openings;
one or more third exit openings;
one or more exhaust openings;
wherein the printer further comprises:
a first inlet supply channel connected to the one or more first exit openings for guiding a first precursor fluid onto the substrate through the one or more first exit openings;
a second inlet supply channel connected to the one or more second exit openings for guiding a second precursor fluid onto the substrate through the one or more second exit openings;
a third inlet supply channel connected to the one or more third exit openings for guiding an inert fluid onto the substrate through the one or more third exit openings;
one or more outlet channels connected to the one or more exhaust openings for removing non-deposited first precursor fluid, non-deposited second precursor fluid, and inert fluid from the substrate;
wherein the substrate plate is movable in relation to the printer head:
along an axis in an X, Y plane defined by an X axis and an Y axis being perpendicular in relation to each other;
along a Z axis being perpendicular to the X, Y plane; and
at a first angle φ defining a rotation of the X, Y plane around the Z axis;
wherein the substrate plate and the printer head are movable in relation to each other at a second angle θ defining a tilting of the X, Y plane around an axis in the X,Y plane,
wherein the one or more exhaust openings include:
one or more first exhaust openings connected to a first outlet channel for removing non-deposited first precursor fluid, and possibly inert fluid, from the substrate; and one or more second exhaust openings connected to a second outlet channel for removing non-deposited second precursor fluid, and possibly inert fluid, from the substrate.

2. The Printer according to claim 1, wherein the printer head is stationary in the X, Y plane and along the Z axis
   wherein the X,Y plane is extending in parallel with the substrate plate, and
   wherein the rotation of the X, Y plane around the Z axis is a rotation of the substrate plate.

3. The Printer according to claim 1, wherein the tilting of the X, Y plane is a tilting of the substrate plate in relation to the printer head, and/or
   wherein the printer head is tiltable.

4. The Printer according to claim 1, wherein the second angle (θ) is in the range of 0.5 degrees.

5. The Printer according to claim 1, wherein the Z axis extends between the printer head and the substrate plate defining a distance between the printer head and the substrate plate, and
   wherein the distance between the printer head and the substrate plate is in a range of 0.005-100 μm.

6. The Printer according to claim 1, wherein the outlet surface of the printer head further comprises a safety evacuation channel positioned outermost around the first, second, and third exit openings and the exhaust openings.

7. The Printer according to claim 1, wherein the printer head outlet surface is in the form of a disc, a square, a rectangle, a triangle, a pentangle, or similar with the sets of opening each forms a circular discs.

8. The Printer according to claim 1, wherein the printer is adapted for varying the distance between the printer head and the substrate plate during printing of a three-dimensional structure.

9. The Printer according to claim 1, wherein the printer is adapted for operating at a deposition speed of 1 nm/min or below, or
   wherein the printer is adapted for operating at a deposition speed in a range of 0.1 nm/min.

10. The Printer according to claim 1, wherein the printer is adapted for operating at atmospheric pressure, at vacuum or at ultra-high vacuum.

11. The Printer according to claim 1, wherein the printer is adapted for controlling a temperature of the printer head and/or the supply channels.

12. The Printer according to claim 1, wherein the printer comprises a heating/cooling source heating at least the printer head to allow for it to operate at temperatures between 10° C.

13. The Printer according to claim 1, wherein the printer is adapted for providing a pattern resolution of 20 nm-1 mm.

14. The Printer according to claim 1, wherein the printer head plate further comprises:
   one or more first distribution channels adapted for guiding the first precursor fluid from the first inlet supply channel to the one or more first exit openings;
   one or more second distribution channels adapted for distributing the second precursor fluid from the second inlet supply channel to the one or more second exit openings;
   one or more third distribution channels adapted for distributing the inert fluid from the third inlet supply channel to the one or more third exit openings.

15. The Printer according to claim 1, wherein the printer head plate is removably attached to the printer head such that different printer head plates can be connected to the printer head, the different printer head plates having varying sizes of the opening diameter of the first exit opening.

16. The Printer according to claim 1, wherein the one or more second and third exit openings and the one or more exhaust openings are positioned in one or more of the following positions:
   around the one or more first exit openings;
   circumferentially around each of the one or more first exit openings; and
   symmetrically around the one or more first precursors openings.

17. The Printer according to claim 1, wherein:
   a primary set of exhaust openings is positioned between each of the first exit openings and a primary set of second exit openings; and/or
   a primary set of third exit openings is positioned between each of the first exit openings and a primary set of second exit openings,
   wherein there is a precursor fluid distance between the one or more first exit openings and the primary set of second exit openings being between 5 μm and 3.000 μm.

18. A method for material deposition or material etching on a substrate in a selective area, the method comprising the steps of:
   providing an atomic layer process printer with a substrate plate and a printer head positioned opposite each other,
   wherein the substrate plate is movable in relation to the printer head:
      along an axis in an X, Y plane defined by an X axis and an Y axis being perpendicular in relation to each other;
      along a Z axis being perpendicular to the X, Y plane; and
      at a first angle φ defining a rotation of the X,Y plane around the Z axis; and
   wherein the substrate plate and the printer head are movable in relation to each other in a second angle ø defining a tilting of the X, Y plane around an axis in the X, Y plane;
   positioning a substrate on the substrate plate;
   wherein the method further comprises the steps of sub-method A), or sub-method B), or sub-method C), or sub-method D),
   wherein sub-method A) comprises the steps:
      exposing the substrate to a first precursor fluid through one or more first exit openings each having a diameter smaller than 900 micro meters;
      removing the first precursor fluid not deposited on the substrate by means of one or more exhaust openings in combination with exposing the substrate to an inert fluid;
      exposing the substrate with the first precursor deposited thereon to a second precursor fluid;
      removing the second precursor fluid not deposited on the substrate by means of the one or more exhaust openings in combination with exposing the substrate to an inert fluid,
   wherein sub-method B) comprises the steps:
      exposing the substrate to a first precursor fluid through one or more first exit openings each having a diameter smaller than 900 micro meters;
      removing the first precursor fluid not deposited on the substrate by means of one or more exhaust openings in combination with exposing the substrate to an inert fluid through the one or more first exit openings;

exposing the substrate with the first precursor deposited thereon to a second precursor fluid through the one or more first exit openings;

removing the second precursor fluid not deposited on the substrate by means of the one or more exhaust openings in combination with exposing the substrate to an inert fluid through the one or more first exit openings, wherein sub-method C) comprises the steps:

mixing a first precursor fluid and a second precursor fluid;

exposing the substrate to the mixture of the first precursor fluid and the second precursor fluid through one or more first exit openings each having a diameter smaller than 900 micro meters, wherein sub-method D) comprises the steps:

exposing the substrate to a first etching agent through one or more first exit openings each having a diameter smaller than 900 micro meters;

removing the first etching agent not deposited on the substrate by means of one or more exhaust openings in combination with exposing the substrate to an inert fluid through the one or more first exit openings;

exposing the substrate with the first precursor deposited thereon to a second etching agent through the one or more first exit openings;

removing the second etching agent not deposited on the substrate by means of the one or more exhaust openings in combination with exposing the substrate to an inert fluid through the one or more first exit openings.

19. The method according to claim 18 further comprising the step of moving the substrate plate and the printer head in relation to each other between the depositing of the precursor fluids, and/or moving the substrate plate and the printer head in relation to each other at any direction and repeating the steps of claim 18.

20. The method according to claim 18, wherein the rotation of the X, Y plane around the Z axis is a rotation of the substrate plate, wherein the tilting of the X, Y plane is a tilting of the substrate plate in relation to the printer head, wherein the Z axis extends between the printer head and the substrate plate defining a distance between the printer head and the substrate plate, wherein the printer head comprises a printer head plate with a number of openings including:

the one or more first exit openings each having the first exit opening diameter being smaller than 500 micro meters;

one or more second exit openings;

one or more third exit openings;

one or more exhaust openings, wherein the printer further comprises:

a first inlet supply channel connected to the first exit opening for guiding the first precursor fluid/the first etching agent onto the substrate through the one or more first exit openings;

a second inlet supply channel connected to the one or more second exit openings for guiding the second precursor fluid/the second etching agent onto the substrate through the one or more second exit openings;

a third inlet supply channel connected to the one or more third exit openings for guiding the inert fluid onto the substrate through the one or more third exit openings;

one or more outlet channels connected to the one or more exhaust openings for removing non-deposited first precursor fluid/first etching agent, non-deposited second precursor fluid/second etching agent, and inert fluid from the substrate.

* * * * *

UNITED STATES PATENT AND TRADEMARK OFFICE
CERTIFICATE OF CORRECTION

PATENT NO. : 12,049,700 B2
APPLICATION NO. : 17/616165
DATED : July 30, 2024
INVENTOR(S) : Maksym Plakhotnyuk It is certified that error appears in the above-identified patent and that said Letters Patent is hereby corrected as shown below:

In the Claims

Column 25, Line 17 (approx.), Claim 4, delete "0.5" and insert -- 0.5-10 --.

Column 25, Line 40, Claim 9, delete "0.1" and insert -- 0.1-100 --.

Column 25, Line 50, Claim 12, delete "10° C." and insert -- 10-600° C. --.

Column 26, Line 38, Claim 18, delete "ø" and insert -- $\theta$ --.

Signed and Sealed this
Fifth Day of November, 2024

Katherine Kelly Vidal
*Director of the United States Patent and Trademark Office*